(12) United States Patent
Zong

(10) Patent No.: US 11,555,247 B2
(45) Date of Patent: Jan. 17, 2023

(54) COATING APPARATUS AND MOVABLE ELECTRODE ARRANGEMENT, MOVABLE SUPPORT ARRANGEMENT, AND APPLICATION THEREOF

(71) Applicant: JIANGSU FAVORED NANOTECHNOLOGY CO., LTD., Wuxi (CN)

(72) Inventor: Jian Zong, Wuxi (CN)

(73) Assignee: JIANGSU FAVORED NANOTECHNOLOGY CO., LTD., Wuxi (CN)

( * ) Notice: Subject to any disclaimer, the term of this patent is extended or adjusted under 35 U.S.C. 154(b) by 0 days.

(21) Appl. No.: 17/251,778

(22) PCT Filed: Jan. 4, 2020

(86) PCT No.: PCT/CN2020/082798
§ 371 (c)(1),
(2) Date: Dec. 11, 2020

(87) PCT Pub. No.: WO2021/051779
PCT Pub. Date: Mar. 25, 2021

(65) Prior Publication Data
US 2021/0262086 A1 Aug. 26, 2021

(30) Foreign Application Priority Data

Sep. 20, 2019 (CN) .......................... 201910893117.X
Sep. 20, 2019 (CN) .......................... 201910893933.0

(51) Int. Cl.
*C23C 16/40* (2006.01)
*C23C 16/458* (2006.01)
(Continued)

(52) U.S. Cl.
CPC ........ *C23C 16/4584* (2013.01); *C23C 16/455* (2013.01); *C23C 16/50* (2013.01); *C23C 16/52* (2013.01)

(58) Field of Classification Search
CPC ... C23C 16/4584; C23C 16/455; C23C 16/50; C23C 16/52; C23C 16/458;
(Continued)

(56) References Cited

U.S. PATENT DOCUMENTS 4,381,965 A * 5/1983 Maher, Jr. ......... H01J 37/32568
156/345.47
4,694,779 A * 9/1987 Hammond .............. C23C 16/54
156/345.52
(Continued)

FOREIGN PATENT DOCUMENTS

CN 2716283 Y 8/2005
CN 201116306 Y 9/2008
(Continued)

OTHER PUBLICATIONS

English translation of Written Opinion of the International Searching Authority issued in International Patent Application No. PCT/CN2020/082798, dated Jun. 19, 2020.
(Continued)

*Primary Examiner* — Rudy Zervigon
(74) *Attorney, Agent, or Firm* — ParkerHighlander, PLLC

(57) ABSTRACT

A coating apparatus and movable electrode arrangement, movable support arrangement, and application thereof are disclosed. The coating apparatus includes a reactor chamber body and a movable support arrangement. The reactor chamber body has a reactor chamber. The movable support arrangement is received in the reactor chamber and includes one or more electrodes and a movable support. The movable support is adapted for rotating relative to the reactor cham-
(Continued)

ber body. At least one of the electrodes is arranged on the movable support so as for rotating together with the movable support. One or more workpieces to be coated are adapted for being held on the movable support to move together with the movable support.

30 Claims, 13 Drawing Sheets

(51) Int. Cl.
*C23C 16/455* (2006.01)
*C23C 16/50* (2006.01)
*C23C 16/52* (2006.01)

(58) Field of Classification Search
CPC .......... H01J 37/32568; H01J 37/32715; H01J 37/32733; H01L 21/68764; H01L 21/68771
USPC ....... 118/723 E; 156/345.43, 345.44, 345.45, 156/345.46, 345.47
See application file for complete search history.

(56) References Cited

U.S. PATENT DOCUMENTS

| | | | |
|---|---|---|---|
| 6,152,075 | A | 11/2000 | Gardner et al. |
| 11,270,871 | B2 * | 3/2022 | Zong ................. C23C 16/02 |
| 2009/0217874 | A1 | 8/2009 | Fujinami |

FOREIGN PATENT DOCUMENTS

| | | | |
|---|---|---|---|
| CN | 102884610 | A | 1/2013 |
| CN | 103114276 | A | 5/2013 |
| CN | 103243314 | A | 8/2013 |
| CN | 105200393 | A | 12/2015 |
| CN | 106637140 | A | 5/2017 |
| CN | 106756888 | A | 5/2017 |
| CN | 106958012 | A | 7/2017 |
| CN | 107022754 | A | 8/2017 |
| CN | 107287562 | A | 10/2017 |
| CN | 206768216 | U | 12/2017 |
| CN | 206775813 | U | 12/2017 |
| CN | 109183002 | A | 1/2019 |
| CN | 101533759 | A | 9/2019 |
| JP | H059741 | A | 1/1993 |
| JP | H10317171 | A | 12/1998 |
| JP | 2004002905 | A | 1/2004 |
| JP | 2009224423 | A | 10/2009 |

OTHER PUBLICATIONS

English translation of the International Search Report issued in International Patent Application No. PCT/CN2020/082798, dated Jun. 19, 2020.

Office Action issued in Chinese Application No. 201910893933.0, dated Mar. 8, 2021, and English language translation thereof.

Office Action Issued in Chinese Application No. 201910893117.X, dated Jul. 7, 2021 and English language translation thereof.

* cited by examiner

COATING APPARATUS AND MOVABLE ELECTRODE ARRANGEMENT, MOVABLE SUPPORT ARRANGEMENT, AND APPLICATION THEREOF

BACKGROUND OF THE PRESENT INVENTION

Field of Invention

The present invention relates to the field of coating and, in particular, to a coating apparatus and movable electrode arrangement, movable support arrangement, and application thereof.

Description of Related Art

Coating is capable of protecting a material surface and granting the material a good physical and chemical durability. Some coating, such as polymer coating, has a certain anti-corrosion property, which forms a protective layer on the surface of an electronic component, such as electrical equipment, circuit board, and etc., so as to effectively protect the electric circuit from being corroded under an corrosion environment and therefore to enhance the reliability of the electronic component.

During the coating process, the workpiece to be coated has to be placed in a reactor chamber and then a reactant gas is introduced into the chamber. The reactant gas is chemical vapor deposited on the surface of the workpiece to be coated under the effect of plasma to form the coating layer. In this process, it requires to be vacuum continuously in order to remove the tail gas generated during the continuous reaction of the reactant material on the surface of the workpiece, so as to maintain a stable coating pressure condition. Nonetheless, it is worth to note that when the reactant gas passes through the feeding inlet, the reactant material can gather in the vicinity of the feeding inlet easily, rendering higher gas density at the feeding inlet and, on the other hand, lower gas density in the vicinity of an exhaust outlet. Therefore, it is relatively likely to result uneven thickness of the nano-coating of the workpieces at different positions in the reactor chamber due to a density difference of the reactant gas in the reactor chamber. Some traditional manufacturers utilize rotating carrier, wherein the carrier is for the workpiece to be coated to be placed thereon. The carrier can be rotated relative to the reactor chamber so as to perform a mixing and stirring function, which facilitates the evenness and balance of the density of the reactant gas.

To conventional coating apparatus, there are two plasma coating modes usually based on whether the workpiece is placed between the electrodes. One of the modes is to place the workpiece for coating between the electrode plates (within the electrical field). The electrode plates are two or more opposite electrodes being affixed in the reactor chamber, wherein an electrode plate of each pair of electrodes is connected with a high frequency power source, while the other electrode plate is grounded or connected with the other electrode of the power source. When the power is on, the electrical field produced by a pair of the electrode plates excites and turns the gas material therewithin into plasma. Generally speaking, devices for mass production usually utilize parallel electrode plates for stable discharge, high efficiency, and larger processing size and capability. Nevertheless, it is found from the actual utilizations that, because the energy of the plasma between the electrodes is usually relatively high, it can directly impact the surface of the workpiece placed there and render surface damage of the workpiece easily. A typical example is the screen of an electronic product. For example, the screen of a device, such as cellphone, electronic watch, tablet, and etc., is usually anti-fingerprint processed, which surface has a very thin anti-fingerprint coating. This coating will be damaged under the plasma impact, resulting a loss of the anti-fingerprint effect.

Another plasma coating mode is to place the workpiece for coating at an outside of the electrodes and allow the excited reactant material (containing the plasma) be diffused to the surface of the workpiece and deposited thereon to form the protective coating layer. Because the workpiece is not directly placed between the electrode plates and the energy of the plasma becomes weakened and weakened when moving away from the electrical field area, and thus the energy of the plasma is lower while reaching the surface of the workpiece. Comparing to the previous mode, this type of electrode design creates weaker plasma bombardment to the surface of the workpiece. Unfortunately, it is further found from the actual utilizations that this type of electrode arrangement renders lower deposit rate and some monomers that require high plasma energy for activation cannot be activated into the plasma state. Therefore, the use of this mode is restricted. In addition, most plasma coating apparatuses in the market have the positions of their electrodes and reactor chamber fixed relatively with each other, have fixed discharge positions of the electrodes, and only provide fixed discharging environment for the inside of their reactor chamber. Besides, when the carrier is rotating, the electrical discharge of the electrodes can be affected by the carrier. The rotating carrier can somehow provide a shielding effect and obstruct the electrical discharge and eventually affect the yield and quality of the product.

China Patent No. CN206775813 discloses a plasma-initiated polymerization device with a fixed-rotating electrode group. The device has a set of fixed metal straight rods which is fixedly connected to an inner wall of a vacuum chamber at equal intervals along an axial direction of the vacuum chamber through a set of insulated bases, and the fixed metal straight rods are electrically connected in series by wires to form a fixed electrode. The device also has a set of rotating metal rods which is connected to a metal movable frame at equal intervals along an axial direction of the vacuum chamber to function as a rotating electrode. The fixed electrode is connected with a high frequency power source output terminal, while the rotating electrode is grounded. When operating, a high frequency power source is turned on so as to continuously output high frequency power and drive the rotating electrode to rotate. The rotating electrode is periodically moving close to and away from the fixed electrode, so as to generate periodical on-and-off plasma. The advantage of such device is that it achieves the effect of periodically electrical discharge at intervals without impulse modulation through periodically contacting. In this conventional device, the rotating electrode and a substrate are relatively stationary and the plasma is diffused and then deposited on the surface of the substrate to form the polymer coating, while the density of the plasma in various spatial positions still has a gradient issue.

SUMMARY OF THE PRESENT INVENTION

An advantage of the present invention is to provide a coating apparatus and movable electrode arrangement, movable support arrangement and application thereof, wherein one or more electrodes of the coating apparatus are rotatable, so as for providing a relatively even and uniform electrical discharging environment in the reactor chamber of the coating apparatus.

Another advantage of the present invention is to provide a coating apparatus, and movable electrode arrangement, movable support arrangement and application thereof, wherein the one or more electrodes of the coating apparatus can electrically discharge toward a workpiece to be coated located on a rotatable movable support, such that the one or more rotating electrodes electrically discharge toward a moving workpiece to be coated, so as to enhance the evenness and uniformity of the coating.

Another advantage of the present invention is to provide a coating apparatus, and movable electrode arrangement, movable support arrangement and application thereof, wherein, comparing to the stationary electrode of the conventional coating device, the one or more electrodes of the coating apparatus of the present invention are capable of rotating along with the movable support. In addition, a carrier for carrying a workpiece to be coated rotates along a central axis thereof when the carrier is rotating along with the movable support, such that a relative movement between the one or more electrodes of the coating apparatus and the workpiece to be coated is caused by the rotation of the carrier relative to its central axis, which allows the electrode to provide a relatively even and uniform discharging environment for the workpiece to be coated.

Another advantage of the present invention is to provide a coating apparatus, and movable electrode arrangement, movable support arrangement and application thereof, wherein the workpiece to be coated in the coating apparatus can be retained inside the corresponding electrodes as well as can be kept away from the area between the corresponding electrodes during the coating process through the relative movement of the workpiece to be coated relative to the one or more electrodes, so as to avoid the workpiece from staying within the area between the electrodes for too long and causing surface damage to the workpiece.

Another advantage of the present invention is to provide a coating apparatus, and movable electrode arrangement, movable support arrangement and application thereof, wherein the workpiece to be coated in the coating apparatus can be retained inside the corresponding electrodes as well as can be kept away from the area between the corresponding electrodes during the coating process through the relative movement of the workpiece to be coated relative to the one or more electrodes, so as to avoid the plasma merely relying on diffusion for depositing on the surface of the workpiece to be coated that results in slower depositing speed.

Another advantage of the present invention is to provide a coating apparatus, and movable electrode arrangement, movable support arrangement and application thereof, wherein, comparing to the stationary electrode fixed on the chamber wall in a conventional coating device, the one or more electrodes of the coating apparatus of the present invention are configured closer to the workpiece to be coated on the carrying platform.

Another advantage of the present invention is to provide a coating apparatus, and movable electrode arrangement, movable support arrangement and application thereof, wherein the one or more electrodes of the movable support arrangement are movable that such one or more movable electrodes not only make coating evenly and uniformly, but also allow that some of the coating material gas that pass through the electrical discharge area be completely ionized and some of the coating material gas that do not pass through the discharge area of the electrode be incompletely ionized, so that the raw materials do not require ionization may be utilized to provide richer coating structure and stabler coating quality through the adjustment of the coating parameters.

Another advantage of the present invention is to provide a coating apparatus, and movable electrode arrangement, movable support arrangement and application thereof, wherein the positions of the one or more electrodes and the movable support are relatively fixed relative to each other, so that the movable support of the coating apparatus would not affect the electrical discharge of the one or more electrodes.

According to an aspect of the present invention, the present invention provides a coating apparatus, comprising:

a reactor chamber body, wherein the reactor chamber body has a reactor chamber;

a gas extracting arrangement, wherein the gas extracting arrangement is communicatively connected with the reactor chamber body;

a feeding arrangement, wherein the reactor chamber body has a feeding inlet which is communicated with the reactor chamber, wherein the feeding arrangement is communicated to the feeding inlet; and a movable support arrangement, which is received in the reactor chamber, comprising:

one or more electrodes; and a movable support, arranged in a movable manner relative to the reactor chamber body, wherein at least one electrode of the one or more electrodes is arranged on the movable support in a manner that the at least one electrode is arranged on the movable support in such a manner that the at least one electrode is able to be moved along with the movable support, whereby at least one workpiece to be coated is adapted for being supported on the movable support to move along with the movable support.

According to at least one embodiment of the present invention, at least one of the one or more electrodes is arranged at a circumferential direction of the movable support.

According to at least one embodiment of the present invention, at least one of the one or more electrodes has an electrical discharge surface, wherein a facing direction of the electrical discharge surface is arranged facing toward a central axis of the movable support.

According to at least one embodiment of the present invention, at least one of the one or more electrodes has an electrical discharge surface, wherein a facing direction of the electrical discharge surface is arranged facing toward the workpiece to be coated.

According to at least one embodiment of the present invention, at least one of the one or more electrodes is arranged at a radial direction of the movable support.

According to at least one embodiment of the present invention, the coating apparatus further comprises at least one carrier arranged on the movable support, wherein the workpiece to be coated is adapted for being placed on the carrier, and the carrier is mounted on the movable support in a movable manner relative to the movable support, so as to allow a relative movement between the one or more electrodes and the workpiece to be coated.

According to at least one embodiment of the present invention, at least one of the one or more electrodes is arranged between adjacent carriers.

According to at least one embodiment of the present invention, each of the one or more electrodes between the adjacent carriers faces toward the carrier.

According to at least one embodiment of the present invention, two adjacent electrodes form a V-shaped configuration with an opening of the V-shaped configuration facing outwards, wherein the two electrodes are respectively and correspondingly facing toward the two adjacent carriers.

According to at least one embodiment of the present invention, each of the one or more electrodes has an electrical discharge surface, wherein the movable support has at least an electrical conducting member arranged corresponding to one respective electrode of the one or more electrodes, wherein the electrical conducting member has an electrical conducting surface, wherein the conducting surfaces of two adjacent electrical conducting members with an included angle therebetween and the electrical discharge surface of the respective electrode are arranged correspondingly to form a triangular electrical discharge area.

According to at least one embodiment of the present invention, at least one of the one or more electrodes is arranged at an inner side of the carriers, functioning as at least one inner electrode.

According to at least one embodiment of the present invention, at least one of the one or more electrodes is arranged along a peripheral direction of the movable support and between two adjacent carriers, functioning as at least one outer electrode.

According to at least one embodiment of the present invention, the movable support is mounted in the reactor chamber body in a rotatable manner around a first axis of a center thereof.

According to at least one embodiment of the present invention, the one or more carriers are mounted on the movable support in a rotatable manner around a second axis of the center thereof, wherein the second axis is arranged at a peripheral side of the first axis, wherein the movable support is mounted in the reactor chamber body in a rotatable manner around a first axis of the center thereof.

According to at least one embodiment of the present invention, the movable support arrangement further comprises a carrier support which is mounted on the movable support in a rotatable manner around the second axis, wherein the carriers are spacedly and overlapedly arranged on the carrier support along a height direction, wherein each of the one or more electrode is provided between two respective adjacent carrier supports.

According to at least one embodiment of the present invention, the coating apparatus further comprises an electrical conductive unit which comprises a first electrical conductive component and a second electrical conductive component, wherein the first electrical conductive component is mounted on the reactor chamber body, while the second electrical conductive component is mounted on the movable support and electrically connected with the one or more electrodes, wherein when the movable support rotates relative to the reactor chamber body around the first axis, the second electrical conductive component, which rotates relative to the first electrical conductive component, is kept electrically conductive with the first electrical conductive component, to allow an electricity power from an outer side of the reactor chamber body to be transmitted to the second electrical conductive component through the first electrical conductive component and then to the one or more electrodes.

According to at least one embodiment of the present invention, the movable support comprises an upper supporting member and a lower supporting member, wherein the upper supporting member is held above said lower supporting member so as to form and define a carrying space, wherein the second electrical conductive component is arranged on the upper supporting member, wherein the first electrical conductive component is tightly pressed and supported on the second electrical conductive component.

According to at least one embodiment of the present invention, each of the carriers comprises a carrier motion transmission member, wherein the movable support comprises a movable support engaging member engaging with the carrier motion transmission member, wherein the carrier motion transmission member and the movable support engaging member are embodied as gears that are engaged with each other for producing relative planetary gear movement.

According to at least one embodiment of the present invention, each of the one or more electrodes is an electrode plate, wherein the movable support is provided with electrical conducting members arranged relative to the one or more electrodes respectively, wherein two adjacent electrical conducting members with an included angle therebetween and the respective electrode plate are arranged to form a triangle configuration.

According to at least one embodiment of the present invention, the one or more electrodes are intervally arranged around the first axis as a center in a symmetrical manner.

According to at least one embodiment of the present invention, the electrical discharge surface of at least one of the one or more electrodes is a plane surface or curve surface.

According to at least one embodiment of the present invention, at least one of the one or more electrodes is an arc-electrode.

According to at least one embodiment of the present invention, the one or more electrodes and the movable support are opposite electrodes to each other, so that the one or more electrodes are adapted for electrically discharging to aid the movable support.

According to at least one embodiment of the present invention, the movable support is grounded.

According to at least one embodiment of the present invention, the movable support has an electrical conducting surface provided thereon matching with a size of each of the one or more electrodes.

According to at least one embodiment of the present invention, the electrode is an electrode plate, wherein the movable support includes an electrical conducting member arranged thereon relative to the one or more electrodes.

According to at least one embodiment of the present invention, the coating apparatus further comprises an electrode holder, arranged inside the reactor chamber body in a movable manner relative to the reactor chamber body, wherein the one or more electrodes are mounted on the electrode holder.

According to at least one embodiment of the present invention, the electrode holder and the movable support are independent to each other.

According to at least one embodiment of the present invention, the electrode holder and the movable support are made as an integral structure that the electrode holder is a part of the movable support.

According to another aspect of the present invention, the present invention provides a movable electrode arrangement for a coating apparatus which comprises a reactor chamber body, wherein the movable electrode arrangement comprises one or more electrodes, wherein each of the one or more electrodes is a movable electrode and is arranged inside the reactor chamber body in a movable manner relative to the reactor chamber body.

According to at least one embodiment of the present invention, the coating apparatus also comprises a movable support arranged inside of the reactor chamber body in a movable manner relative to the reactor chamber body, wherein at least a workpiece to be coated is adapted for being supported on the movable support so as for being move along the movable support, wherein the one or more electrodes are mounted on the movable support.

According to at least one embodiment of the present invention, a carrier is mounted to the movable support in a rotatable manner around a second axis at a center thereof, and that the second axis is positioned at a peripheral side of a first axis.

According to at least one embodiment of the present invention, the electrodes are intervally arranged around the first axis as a center in a symmetrical manner.

According to at least one embodiment of the present invention, the electrical discharge surface of at least one of the one or more electrodes is a plane surface or curve surface.

According to at least one embodiment of the present invention, at least one of the one or more electrodes is an arc-electrode.

According to at least one embodiment of the present invention, at least one of the one or more electrodes and the movable support are reciprocal electrodes to each other, so that the at least one of the one or more electrodes is adapted for discharging to the movable support.

According to at least one embodiment of the present invention, the movable support is grounded.

According to at least one embodiment of the present invention, the movable support has an electrical conducting surface provided thereon matching with a size of each of the one or more electrodes.

According to at least one embodiment of the present invention, the electrode is an electrode plate, wherein the movable support includes an electrical conducting member arranged thereon relative to the one or more electrodes.

According to at least one embodiment of the present invention, the coating apparatus further comprises a movable support, wherein at least a workpiece to be coated is adapted for being held on the movable support to be moved along with the movable support, wherein the movable electrode arrangement further comprises an electrode holder, arranged inside the reactor chamber body in a movable manner relative to the reactor chamber body, wherein the one or more electrodes are mounted on the electrode holder.

According to at least one embodiment of the present invention, the electrode holder and the movable support are independent to each other.

According to at least one embodiment of the present invention, the electrode holder and the movable support are made as an integral structure that the electrode holder is a part of the movable support.

According to another aspect of the present invention, the present invention provides a movable support arrangement for a coating apparatus comprising a reactor chamber body, wherein the movable support arrangement comprises:

one or more electrodes;

a movable support, arranged in a movable manner relative to the reactor chamber body, wherein at least one of the one or more electrodes is arranged on the movable support in a manner that the one or more electrodes are movable along with the movable support; and one or more carriers arranged on the movable support in a manner that the one or more carriers are able to be moved with the movable support.

According to at least one embodiment of the present invention, the movable support is mounted in the reactor chamber body in a rotatable manner around a first axis, wherein at least one of the one or more electrodes is arranged on the movable support in a rotatable manner along with the movable support, wherein the one or more carriers are arranged on the movable support in such a manner that the one or more carriers are able to be rotated with the movable support around the first axis, wherein the one or more carriers are retained on the movable support in a manner of being rotatable around a second axis.

According to at least one embodiment of the present invention, each of the one or more electrodes has an electrical discharge surface arranged facing toward a central axis of the movable support, or that at least one of the one or more electrodes has an electrical discharge surface arranged facing toward the at least one carrier and the one or more electrodes are retained at a peripheral side of the at least one carrier.

According to at least one embodiment of the present invention, at least one of the one or more electrodes is retained at a peripheral position of the movable support.

According to at least one embodiment of the present invention, the movable support arrangement further comprises a carrier support, wherein the carrier support is mounted on the movable support in a rotatable manner around the second axis, wherein a plurality of the carrier are spacedly stacked on the carrier support along the height direction thereof, wherein the electrode is arranged between two adjacent carrier supports.

According to at least one embodiment of the present invention, the movable support arrangement further comprises a carrier support, wherein the carrier support is mounted on the movable support in a rotatable manner around the second axis, wherein one or more carriers are spacedly stacked on the carrier support along a height direction thereof, wherein each of the one or more electrodes is arranged between two adjacent carriers.

According to at least one embodiment of the present invention, each of the one or more carriers is a circular carrier and a radian of each of the one or more electrodes is the same as the radian of the circular carrier.

According to at least one embodiment of the present invention, the second axis is a central axis of the carrier.

According to at least one embodiment of the present invention, the movable support arrangement comprises at least two electrodes, spacedly and symmetrically arranged around the first axis.

According to at least one embodiment of the present invention, the movable support arrangement comprises at least two electrodes, spacedly and symmetrically arranged around the second axis.

According to at least one embodiment of the present invention, the carrier support comprises an upper support portion, a lower support portion and a side support portion, wherein the upper support portion is supported on the lower support portion through the side support portion, wherein the second axis passes through the upper support portion, the one or more carriers, and the lower support portion, wherein at least one of the electrodes is arranged at the outer side of the side support portion.

According to at least one embodiment of the present invention, each of the one or more electrodes has an electrical discharge surface, wherein the movable support has at least one electrical conducting member arranged relative to the one or more electrodes, wherein the electrical conducting member has an electrical conducting surface, wherein the conducting surfaces of two adjacent electrical conducting members with an included angle defined therebetween and the electrical discharge surface of the electrode arranged correspondingly form a triangle electrical discharge area.

According to at least one embodiment of the present invention, it comprises at least two the carrier supports, symmetrically arranged around the first axis, and at least two the electrodes, arranged at the inner side of the carrier supports.

According to at least one embodiment of the present invention, the movable support arrangement further comprises an electrical conductive unit, wherein the electrical conductive unit comprises a first electrical conductive component and a second electrical conductive component, wherein the first electrical conductive component is arranged in the reactor chamber body and the second electrical conductive component is arranged on the movable support, wherein the first electrical conductive component is conductively connected with the second electrical conductive component and the second electrical conductive component is conductively connected with the one or more electrodes, wherein when the movable support is rotating around the first axis relative to the reactor chamber body, the second electrical conductive component that is rotating relatively with the first electrical conductive component still remains conductively connected with the first electrical conductive component, so as to allow electricity from the outside of the reactor chamber to be conducted to the second electrical conductive component through the first electrical conductive component and to the one or more electrodes.

According to at least one embodiment of the present invention, the movable support comprises an upper supporting member and a lower supporting member, wherein the upper supporting member is held above the lower supporting member so as to form and define a carrying space, wherein the second electrical conductive component is arranged on the upper supporting member, wherein the first electrical conductive component is tightly pressed and supported on the second electrical conductive component.

According to at least one embodiment of the present invention, each carrier comprises a carrier motion transmission member, wherein the movable support comprises a movable support engaging member engaging with the carrier motion transmission member, wherein the carrier motion transmission member and the movable support engaging member are embodied as gears that engaged with each other to produce relative movement therebetween.

The present invention also provides an electrode discharge method comprising a step of:

when at least one workpiece to be coated is moved relative to a reactor chamber body along with a movement of a movable support, electrically discharging from at least one electrode, which is moving relatively with the reactor chamber body in the reactor chamber body, relative to the movable support.

According to at least one embodiment of the present invention, the electrode discharge method comprises a step of moving the at least one electrode and the workpiece to be coated along with the movement of the movable support.

According to at least one embodiment of the present invention, the electrode discharge method further comprises a step of having the at least one electrode and the workpiece to be coated to move relatively to each other.

According to at least one embodiment of the present invention, the electrode discharge method further comprises a step of driving at least one carrier that carries the workpiece to be coated by the movable support to move.

According to at least one embodiment of the present invention, the electrode discharge method further comprises a step of rotating the carrier around a first axis of a center of the movable support and around a second axis of a center of the carrier and rotating the electrode around the first axis.

Still further objects and advantages will become apparent from a consideration of the ensuing description and drawings.

These and other objectives, features, and advantages of the present invention will become apparent from the following detailed description, the accompanying drawings, and the appended claims.

DETAILED DESCRIPTION OF THE PREFERRED EMBODIMENT

The following description is disclosed to enable any person skilled in the art to make and use the present invention. Preferred embodiments are provided in the following description only as examples and modifications will be apparent to those skilled in the art. The general principles defined in the following description would be applied to other embodiments, alternatives, modifications, equivalents, and applications without departing from the spirit and scope of the present invention.

Those skilled in the art should understand that, in the disclosure of the present invention, terminologies of "longitudinal," "lateral," "upper," "front," "back," "left," "right," "perpendicular," "horizontal," "top," "bottom," "inner," "outer," and etc. just indicate relations of direction or position are based on the relations of direction or position shown in the appended drawings, which is only to facilitate descriptions of the present invention and to simplify the descriptions, rather than to indicate or imply that the referred device or element must apply specific direction or to be operated or configured in specific direction. Therefore, the above-mentioned terminologies shall not be interpreted as confine to the present invention.

It is understandable that the term "a" should be understood as "at least one" or "one or more". In other words, in one embodiment, the number of an element can be one and in other embodiment the number of the element can be greater than one. The term "a" is not construed as a limitation of quantity.

Figure 9:
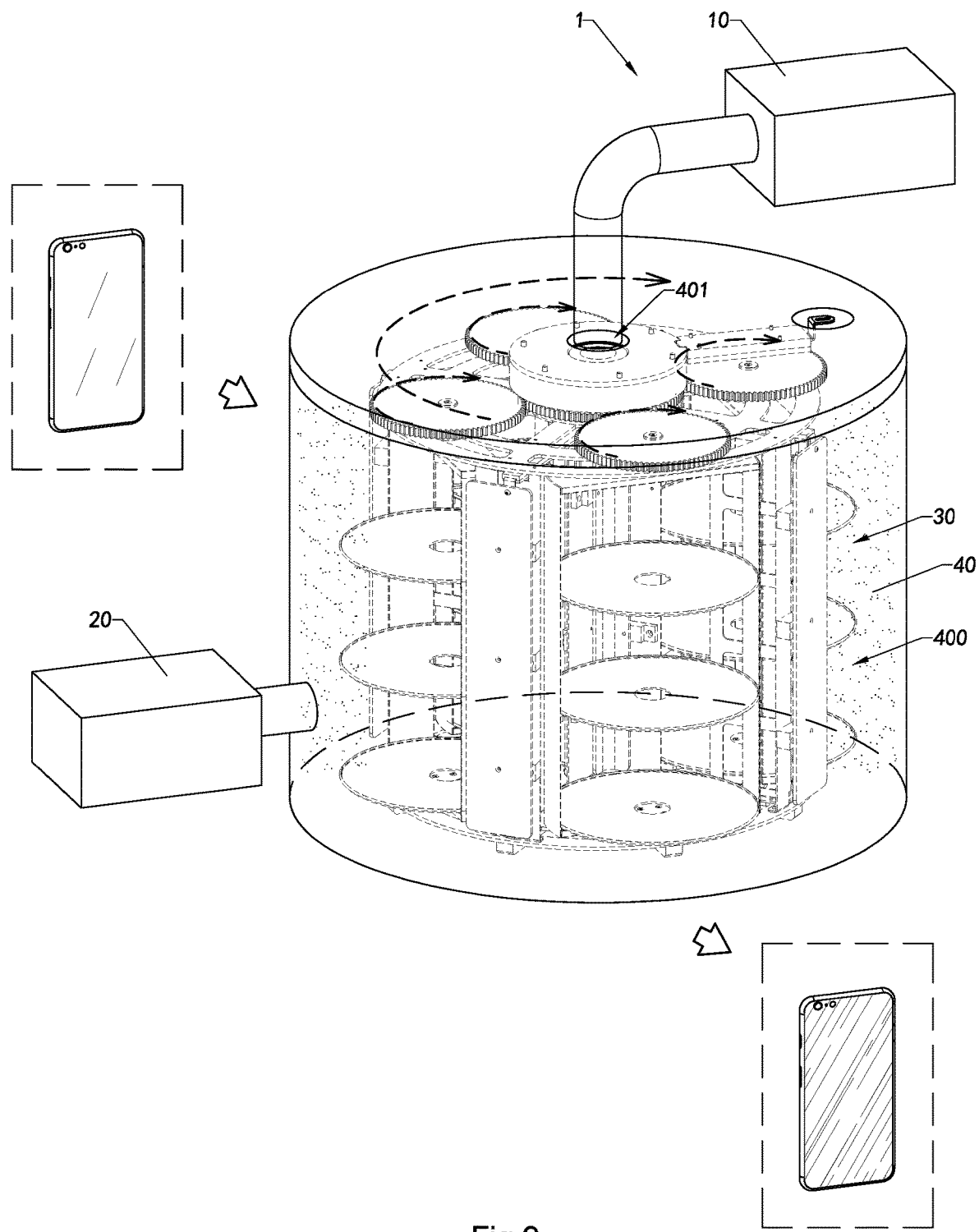
FIG. 9 is a perspective view illustrating an application of the coating apparatus according to the above preferred embodiment of the present invention.

Referring to FIGS. 1-4, a coating apparatus 1 and a movable support arrangement 30 thereof according to a preferred embodiment of the present invention are illustrated. FIG. 9 is a perspective view illustrating an application of the coating apparatus 1.

The coating apparatus 1 is capable of coating surface(s) of one or more workpieces to be coated. The coating serves to protect the surface(s) of the one or more workpieces to be coated, so as for prolonging the service life of the one or more workpieces to be coated.

The coating apparatus 1 comprises a feeding arrangement 10, an gas extracting arrangement 20, the movable support arrangement 30, a reactor chamber body 40, and a movable electrode arrangement 50, wherein the reactor chamber body 40 comprises a housing body 41 and has a reactor chamber 400, wherein the housing body 41 is formed surroundingly to form and define the reactor chamber 400 therein.

The feeding arrangement 10 is arranged for feeding raw materials, such as reactant gas and etc. The reactant gas may be directly from a gas source or generated from vaporizing a liquid form raw material. The feeding arrangement 10 is connected with the housing body 41 in such a manner that the feeding arrangement 10 is communicatively connected with the reactor chamber 400.

The gas extracting arrangement 20 is for air exhaustion, so as to ensure that the reactor chamber 400 stays in a predetermined negative pressure environment. The gas extracting arrangement 20 is connected with the housing body 41 in such a manner that the gas extracting arrangement 20 is communicating with the reactor chamber 400.

The movable support arrangement 30 is for placing one or more workpieces to be coated. The one or more workpieces to be coated being held on the movable support arrangement 30 can then be coated in the reactor chamber body 40. The movable support arrangement 30 is accommodated in the reactor chamber 400 and is rotatably arranged with the housing body 41.

The movable electrode arrangement 50 is capable of electrically discharging and moving relative to the workpiece to be coated, so as to facilitate the coating performance and effect of the workpiece to be coated. The movable electrode arrangement 50 comprises one or more electrodes 36, wherein at least one of the one or more electrodes 36 is movable relative to the reactor chamber body 40.

Optionally, the reactor chamber body 40 has a symmetrical configuration, such as cylinder shape and etc., so as to facilitate the evenness and uniformity of the reactant gas within the reactor chamber 400.

The movable support arrangement 30 comprises a movable support 31 and one or more sets of carriers 32 arranged on the movable support 31 for placing the one or more workpieces thereon respectively. The movable support 31 of the movable support arrangement 30 can move relative to the reactor chamber body 40 and the workpiece to be coated can be placed and retained at the movable support arrangement 30 so as to allow the workpiece to be coated to move relative to the reactor chamber body 40.

The movable support 31 may be, but not limited to, moving relative to the reactor chamber body 40 in a rotatable manner, or alternatively, be reciprocal movement, swinging movement or other modes.

The one or more electrodes 36 can electrically discharge. For example, the one or more electrodes 36 moving relative to the reactor chamber body 40 are negative electrodes while the reactor chamber body 40 can be made of conductive metal so as to function as a positive electrode, and thus enable electrical discharge in the reactor chamber 400. According to this embodiment of the present invention, the movable support 31 and the one or more electrodes 36 are opposite electrodes to each other, so that the one or more electrodes 36 can electrically discharge to the movable support 31. The movable support 31 can further be grounded.

According to the present embodiment, the movable support arrangement 30 is rotatably arranged in the housing body 41 about a first axis A. The housing body 41 comprises an upper housing 411, a lower housing 412, and a side wall 413 extended between the upper housing 411 and the lower housing 412 peripherally. The upper housing 411, the lower housing 412 and the side wall 413 form and define the reactor chamber 400 in a surrounding and enclosing manner. The upper housing 411 and the lower housing 412 are opposingly arranged.

The feeding arrangement 10 may selectively be connected to the upper housing 411, the lower housing 412 or the side wall 413 of the housing body 41. The gas extracting arrangement 20 may selectively be connected on the upper housing 411, the lower housing 412 or the side wall 413 of the housing body 41. Optionally, a feeding inlet 401 and a gas exhaust outlet of the reactor chamber body 40 are symmetrically arranged. Certainly, the above is merely to give an example, while person skilled in the art may arrange the parts according to his/her needs.

Optionally, the first axis A may be a central axis of the reactor chamber body 40 or a central axis of the movable support arrangement 30.

A plurality of workpieces to be coated can be arranged around the first axis A and is adapted for following the rotation of the movable support arrangement 30 to rotate, that is rotating around the first axis A. In this process, on one hand, the movement of the movable support arrangement 30 drives the gas in the reactor chamber body 40 to flow, wherein the movable support arrangement 30 itself serves as a mixer that facilitates the mixing of the reactant gas in the reactor chamber body 40 evenly and uniformly. In addition, the workpieces to be coated are also driven by the movable support arrangement 30 to move relative to the reactor chamber body 40, which increases the probability of the reactant gas in various positions of the reactor chamber body 40 in contact with the workpieces to be coated so as to facilitate the evenness and uniformity of the final coating.

It is worth mentioning that the one or more workpieces to be coated are all not only capable of rotating around the first axis A, but each is also capable of rotating around a second axis B of one or more second axes B. The one or more second axes B are preferred to be located parallelly around the first axis A. Besides, when the quantity of the carrier 32 of each set of carriers 32 is more than one, the carriers 32 of each set of carriers 43 are preferred to be coaxially aligned and rotatably arranged about one second axis B. Preferably, the first axis A is the central axis of the movable support 31, while each of the second axes B is the central axis of the corresponding set of carriers 32.

It is understandable that the workpieces to be coated placed on the carriers 32 are capable of not only rotating around a central axle, but, according to other embodiments, moving in other manners, such as reciprocal movement, elliptical movement, spherical movement, planetary movement, and etc. By the time the one or more electrodes move relative to the reactor chamber body 40, they also move relative to the workpieces to be coated.

Specifically speaking, the movable support arrangement 30 comprises the movable support 31 and the sets of the carriers 32, wherein the carriers 32 are mounted on the movable support 31. The carriers 32 are for accommodating the workpieces to be coated. A single of the movable support 31 may have a plurality of sets of carriers 32 mounted thereon. The carriers 32 may be arranged on the same level or be overlappingly arranged. In other words, the movable support 31 has a predetermined height and allows each of the one or more sets of carriers 32 to be disposed along a height direction thereof, so as to accommodate more of the workpieces to be coated.

The carriers 32 are capable of rotating around the first axis A with the movable support 31. The sets of carriers 32 are also capable of rotating around the second axes B respectively. In other words, the carriers 32 are arranged to be capable of rotating around the first axis A and rotating around the second axis B at the same time. Therefore, according to the preferred embodiment of the present invention, it not only facilitates to enhance the mixing and stirring intensity of the movable support 31 of the movable support arrangement 30 with respect to the reactant gas in the entire reactor chamber body 40, but also facilitates to increase the probability of all the portions of the workpieces to be coated on the carriers 32 being in contact with the reactant gas in the reactor chamber body 40, which both benefit the evenness and uniformity of the coating on all portions of the workpieces to be coated.

In detail, the movable support 31 comprises an upper supporting member 311, a lower supporting member 312 and a plurality of pillars 313, wherein the position the upper supporting member 311 is higher than the position of the lower supporting member 312, the upper supporting member 311 is positioned closer to the upper housing 411 of the housing body 41, and the lower supporting member 312 is positioned closer to the lower housing 412 of the housing body 41. The pillars 313 are extended between and connected with the upper supporting member 311 and the lower supporting member 312. The upper supporting member 311 is supported above the lower supporting member 312 through the pillars 313.

The movable support 31 has at least a carrying space 310, wherein the carrying space 310 is located in the reactor chamber 400 and communicated with the reactor chamber 400. Each of the carriers 32 is held at a predetermined height and position in the carrying space 310 and the carriers 32 are rotatably held in the carrying space 310.

More specifically, the movable support arrangement 30 further comprises one or more carrier supports 33, wherein the carrier supports 33 are connected with the upper supporting member 311 and the lower supporting member 312 of the movable support 31. Besides, each of the carrier supports 33 is rotatably connected between the upper supporting member 311 and the lower supporting member 312 of the movable support 31 in a manner of being rotatable about one corresponding second axis B of the second axes B. The quantity of the carrier support 33 can be multiple. The carrier supports 33 are mounted on the movable support 31 in a manner of surrounding around the first axis A.

When the movable support 31 of the movable support arrangement 30 is driven to rotate around the first axis A, each of the one or more carrier supports 33 of the movable support arrangement 30 is also driven to rotate about its respective second axis B, such that each of the workpieces to be coated placed on the movable support arrangement 30 can rotatably move around the first axis A as well as the corresponding second axis B at the same time.

Further, multiple carriers 32 can be arranged as a set on one single carrier support 33 and are stacked on the carrier support 33 along a height direction thereof. Optionally, the second axis B passes through a center of every of the set of carriers 32 of the single carrier support 33. In other words, the set of carriers 32 can revolve around the first axis A and rotate about the second axis B in the reactor chamber 400 too.

Optionally, each of the carriers 32 can be in a circular, triangular, rectangular, and other shape. Certainly, the carrier 32 may also be in an irregular shape. Person skilled in the art should be able to understand that the above disclosure is only for providing examples rather than creating any limitation to the present invention.

According to this preferred embodiment, the carrier support 33 comprises an upper support portion 331, a lower support portion 332 and a side support portion 333, wherein the upper support portion 331 and the lower support portion 332 are opposingly arranged, wherein the upper support portion 331 and the lower support portion 332 are connected through the side support portion 333 extended therebetween. Each of the carriers 32 is affixed to the side support portion 333. The side support portion 333 may be arranged with a plurality of the carriers 32 affixed thereto.

The entire carrier support 33 can be driven to revolve and rotate around the first axis A passing through the upper supporting member 311 and the lower supporting member 312 of the movable support 31 and to rotate about the second axis B passing through the upper support portion 331 and the lower support portion 332 of the carrier support 33.

The carrier support 33 is designed to have the carriers 32 be fully exposed in the reactor chamber 400 in a predetermined manner, so as to facilitate the contact between the workpieces to be coated placed on the carriers 32 and the reactant gas in the reactor chamber 400. Optionally, the carrier support 33 has a rectangle configuration. Optionally, the carrier support 33 is a hollow structure.

According to present embodiment, the quantity of the carrier support 33 is four, which are respectively arranged around the first axis A. Preferably, the carrier supports 33 are evenly and uniformly arranged around the first axis A intervally.

It is understandable that the quantity of the carrier support 33 may also be one, two or more. Person skilled in the art may make reasonable modification and alternative to the quantity of the carrier support 33 according to the actual requirement.

Further, the movable support 31 of the movable support arrangement 30 revolves and rotates around the first axis A while the carrier supports 33 are operatively linked to rotate about the second axis B correspondingly.

Figure 4:
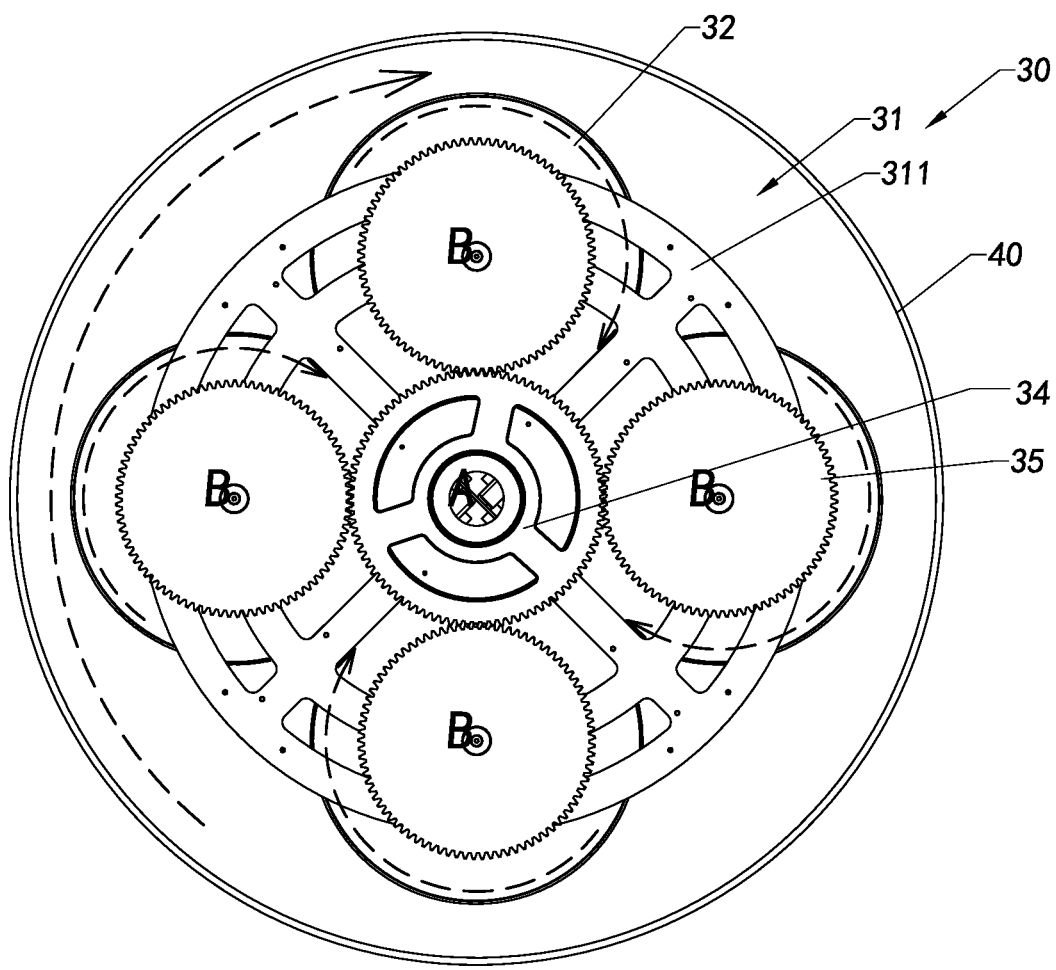
FIG. 4 is a top view of the movable support arrangement according to the above preferred embodiment of the present invention.

Referring to FIG. 4, specifically speaking, the movable support arrangement 30 also comprises a movable support engaging member 34 and one or more carrier motion transmission members 35. Each of the carrier motion transmission members 35 is embodied as a gear and the movable support engaging member 34 is an intermediate gear engaged with the one or more carrier motion transmission members 35 operatively and correspondingly. The movable support engaging member 34 is fixedly mounted on the movable support 31. Each of the carrier motion transmission members 35 is capable of being rotated relative to the movable support engaging member 34. Besides, the carrier motion transmission members 35 are engagingly arranged around the movable support engaging member 34.

In other words, the rotation of the movable support engaging member 34 is correspondingly limited by the carrier motion transmission member 35 and the rotation of the carrier support 33 is correspondingly limited by the movable support engaging member 34. The movable support engaging member 34 and the one or more carrier motion transmission members 35 are operatively linked and affected with each other. The movable support engaging member 34 is affixed on the movable support 31 and thus the movable support engaging member 34 and the movable support 31 are rotatable around the first axis A together. Each of the carrier motion transmission members 35 is affixed to the corresponding carrier support 33 and thus each of the carrier motion transmission members 35 and the corresponding carrier support 33 are rotatable about the respective second axis B together. Hence, one may control the relative movements of the movable support 31 and the carrier support 33 through controlling the movable support engaging member 34 and the carrier motion transmission members 35. Accordingly, the workpieces to be coated and placed on the carriers 32 may revolve around the first axis A and rotate around the second axis B as well. Specific structure of the movable support arrangement 30 may further refer to China Pat. No. ZL201611076982,8, which content is incorporated in the present application as reference.

Optionally, the movable support engaging member 34 and the carrier motion transmission members 35 are respectively embodied as a gear and the movable support engaging member 34 is engaged with the one or more carrier motion transmission members 35. One may control the relative movements of the movable support 31 and the carrier support 33, such as the speed ratio of the movable support 31 and the carrier support 33, through controlling the relative parameters of the movable support engaging member 34 and the carrier motion transmission members 35.

It is worth mentioning that the simultaneous rotations of the movable support 31 and the one or more carrier supports 33 can be achieved merely through driving either the movable support 31 or one of the carrier supports 33 by means of the movable support engaging member 34 and the carrier motion transmission members 35.

According to the present embodiment, the movable support engaging member 34 is embodied to be affixed relative to the movable support 31 and the movements of multiple carrier motion transmission members 35, such as keeping the uniformity and balance of the movements of the carrier motion transmission members 35, are controlled through the transmission relation between the movable support engaging member 34 and each of the carrier motion transmission members 35.

According to the present embodiment, the movable support engaging member 34 is positioned above the upper supporting member 311 of the movable support 31. The movable support engaging member 34 can be supported on the upper supporting member 311. The one or more carrier motion transmission members 35 are positioned above the upper supporting member 311 of the movable support 31 while a predetermined distance is kept between the one or more carrier motion transmission members 35 and the upper supporting member 311, so as to benefit the rotation of each of the carrier motion transmission members 35 with respect to the upper supporting member 311.

Figure 5A:
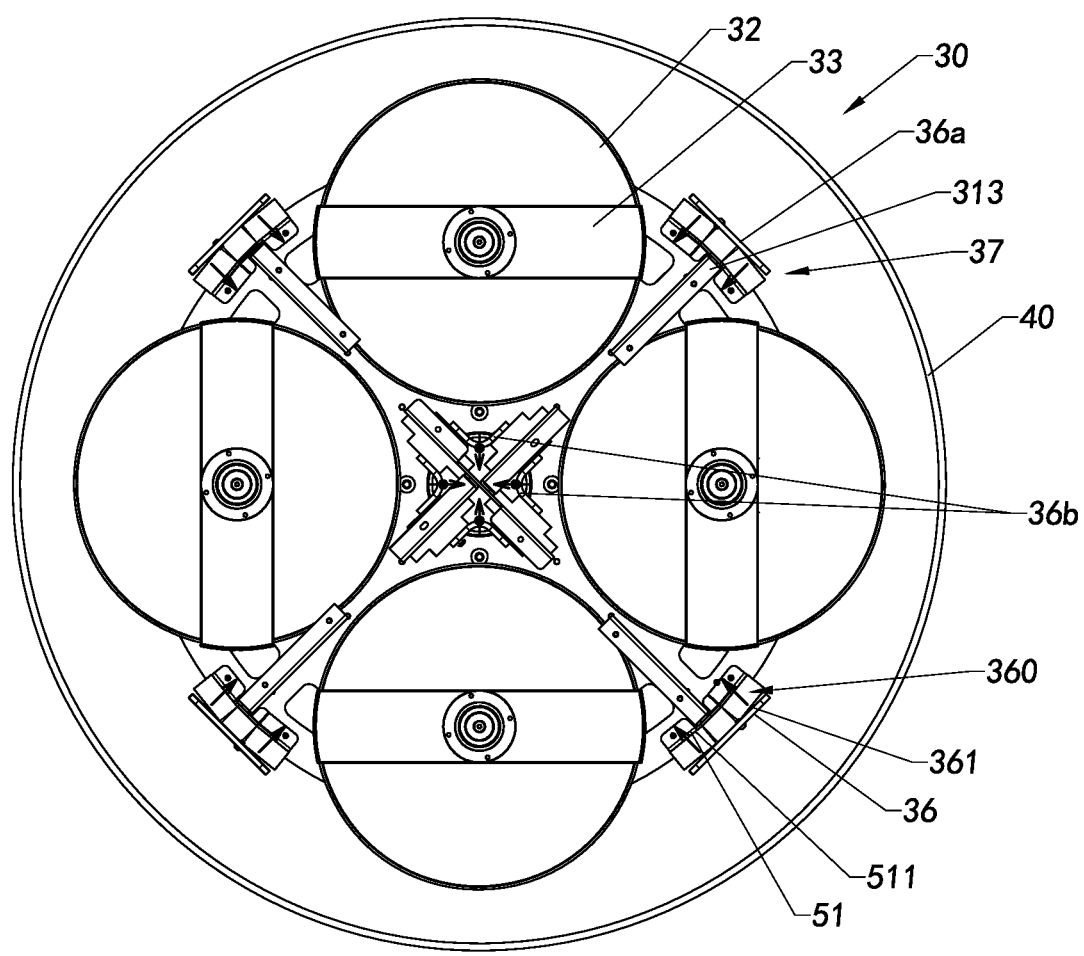
FIG. 5A is a schematic view illustrating electrical discharging of the movable support arrangement according to the above preferred embodiment of the present invention.

Further, referring to FIGS. 4 and 5A, the movable support arrangement 30 comprises one or more electrodes 36, wherein the one or more electrodes 36 are arranged at the movable support 31. The one or more electrodes 36, after electrified, are capable of discharging electricity with respect to the movable support 31 in the reactor chamber body 40, so as to enable the reactant gas to react in an ionized environment and then deposit on the surfaces of the workpieces to be coated to form the coating layers.

In other words, according to the present embodiment, the electrodes 36 can be rotated together with the movable support 31 so as to enable the electrodes 36 to move relative to the reactor chamber body 40 that benefits the evenness and uniformity of the coating of the workpieces to be coated.

Specifically speaking, during the operation of the coating apparatus 1, the housing body 41 of the reactor chamber body 40 is maintained stationary, and the movable support 31 of the movable support arrangement 30 is revolving and rotating around the first axis A, so that the one or more electrodes 36 and the one or more carriers 32 provided on the movable support 31 also revolve around the first axis A simultaneously, while the one or more carriers 32 also rotate around the second axis B at the same time. In other words, the one and more electrodes 36 and the one or more carriers 32 move relative to each other. The one or more electrodes 36 discharge electricity to form a plasma environment that, for the workpieces to be coated placed on the carriers 32, the moving electrodes 36 facilitate to provide a more even and uniform coating environment for the workpieces to be coated placed on the carriers 32.

It is worth noting that the one or more electrodes 36 can be evenly and uniformly arranged around the carriers 32 so as to facilitate providing an even and uniform plasma environment. Especially for the workpiece to be double-side coated, the workpiece can be set to stand on the carrier 32 in a manner that one of the electrodes 36 located near the carrier 32 can face toward the front side of the workpiece to be coated, while another of the electrodes 36 located near the carrier 32 can face toward the back side of the workpiece to be coated, so as to facilitate the evenness and uniformity of the coating on both sides of the workpiece to be coated.

Specifically, at least one pillar 313 is arranged at a peripheral position of the upper supporting member 311 and the lower supporting member 312. At least one electrode 36 is arranged on the at least one pillar 313 and faces toward a middle position of the movable support 31.

The at least one electrode 36 may be an electrode plate, extending between the upper supporting member 311 and the lower supporting member 312. According to the present embodiment, the at least one electrode 36 is held between the upper supporting member 311 and the lower supporting member 312 of the movable support 31 through the at least one pillar 313.

According to this embodiment, every two carrier supports 33 have one of the electrodes 36 arranged therebetween. When the quantity of the carrier support 33 is four, the quantity of the electrode 36 arranged at the peripheral position of the movable support 31 is four as well.

Further, the movable support arrangement 30 may comprise an electrode holder 37 mounted on the housing body 41 of the reactor chamber body 40 and adapted to move relative to the reactor chamber body 40. One or more electrodes 36 are arranged on the electrode holder 37 for moving together with the electrode holder 37. It is worth noting that the electrodes 36 moving together with the electrode holder 37 are capable of not only moving relative to the reactor chamber body 40, but also moving relative to the workpieces to be coated.

Figure 5B:
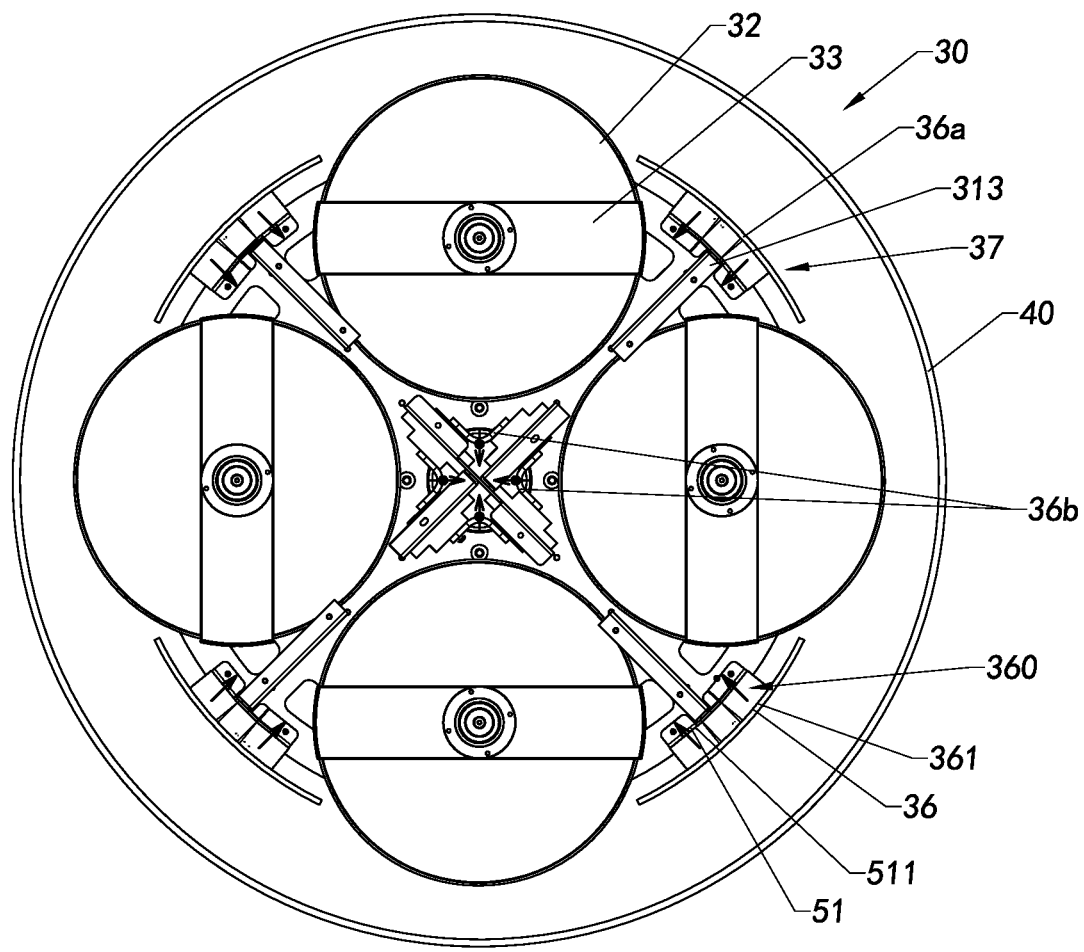
FIG. 5B is a schematic view illustrating electrical discharging of a movable support arrangement according to an alternative mode of the above preferred embodiment of the present invention.

It is worth noted that each of the electrodes 36 may be a negative electrode or a positive electrode. Each of the electrodes 36 can coordinate with another electrical conducting member 51 for the electrical discharging so as to create and provide an electrical field, as shown in FIGS. 5A and 5B. The electrical conducting member 51 may be arranged on the electrode holder 37 or the housing body 41 of the reactor chamber body 40.

The electrical conducting member 51 has an electrical conducting surface 511. The electrical conducting surface 511 faces towards an electrical discharge surface 361 of the corresponding electrode 36. It is appreciated that the electrical conducting surface 511 and the electrical discharge surface 361 may respectively be a plane surface or a curve surface. According to the present embodiment, each of the electrical conducting surface 511 and the electrical discharge surface 361 is embodied as a curve surface and a predetermined distance is kept between the electrical conducting surface 511 and the electrical discharge surface 361 so as to form a discharge area 360. Optionally, a same distance is formed between each of the electrical conducting surfaces 511 and the corresponding electrical discharge surface 361.

According to this embodiment of the present invention, the one or more electrical conducting members 51 are integrally arranged with the movable support 31 and grounded. Alternatively, the movable support 31 may not have obvious plate structure but have an electrical conducting surface 511 formed at the position corresponding to the respective electrode 36 and matching with the size of the respective electrode 36.

Alternatively, at least a portion of the housing body 41 of the reactor chamber body 40 is electrically conductive, so as to enable electrical discharging between the one or more electrodes 36 and the housing body 41 of the reactor chamber body 40.

According to this embodiment, the electrode holder 37 is mounted on the movable support 31 and the electrode holder 37 comprises at least one pillar 313. Or, in other words, the electrode holder 37 is a portion of the movable support 31 that allows the corresponding electrode(s) 36 to be mounted on the movable support 31 directly. Nevertheless, according to another alternative mode, the electrode holder 37 and the movable support 31 can be independent to each other. That is, according to at least an alternative mode of the preferred embodiment of the present invention, the electrode holder 37 can directly be mounted to the housing body 41 of the reactor chamber body 40 and the electrode holder 37 can, but not limited to, be mounted on the housing body 41 in a rotatable manner.

According to this embodiment of the present invention, the one or more electrodes 36 and the one or more electrical conducting members 51 can be mounted to the movable support 31 and insulated with each other. The one or more electrical conducting members 51 are respectively positioned at inner sides of the one or more electrodes 36. When the one or more electrodes 36 and the one or more electrical conducting members 51 are respectively electrified, each of the one or more electrodes 36 positioned at an outer side of the corresponding electrical conducting member 51 electrically discharges towards the corresponding electrical conducting member 51. Certainly, a person skilled in the art should be able to understand that the electrical discharge mode here is just an example for description.

It is worth to note that the one or more electrodes 36 can be arranged between the adjacent carrier supports 33 that each is arranged between the adjacent carriers 32 and is located at a peripheral position of the movable support 31. The one or more electrodes 36 arranged on the movable support 31 do not occupy any useful space of the movable support 31 since when there is no electrode arranged on the movable support 31, the space between the adjacent carrier supports 33 is vacant, and thus the movable support 31 has no need to enlarge its size for the arrangement of the electrodes 36.

It is worth to note that the one or more electrodes 36 are located at the peripheral positions of the movable support 31, wherein the one or more electrodes 36 can be arranged at the peripheral positions of the movable support 31 located between the upper supporting member 311 and the lower supporting member 312 or, alternatively, the electrode holders 37 can be arranged at the peripheral positions of the movable support 31, located between the upper supporting member 311 and the lower supporting member 312, and the one or more electrodes 36 are arranged at the peripheral positions of the movable support 31 by being respectively mounted on the electrode holders 37.

According to at least one preferred embodiment of the present invention, each of the carrier supports 33 is arranged corresponding to one of the electrodes 36, while the electrodes 36 can be arranged at the outer sides of the carrier supports 33 respectively.

According to at least one preferred embodiment of the present invention, each of the one or more electrodes 36 can be arranged between the adjacent carrier supports 33 and a distance between each of the electrodes 36 and a middle position of the movable support 31 is shorter than a radius of the movable support 31. Certainly, person skilled in the art should be able to understand that the cross section of the movable support 31 may be in round shape, triangular shape or other shape.

According to at least one preferred embodiment of the present invention, the one or more electrodes 36 can be arranged and disposed on the carrier support 33. In other words, the one or more electrodes 36 may revolve around the first axis A and rotate around the second axis B at the same time.

Further, at least one or more of the electrodes 36 are arranged at a middle position of the movable support 31. Specifically speaking, at least one or more of the electrodes are arranged among a plurality of the carrier supports 33 and surrounding the first axis A. In other words, the electrodes 36 can be arranged in the inner sides of the carrier supports 33 for being closer to the first axis A.

One or more of the pillars 313 can be installed at a middle position between the upper supporting member 311 and the lower supporting member 312, while the one or more electrodes 36 can be mounted on the one or more pillars 313 respectively and be positioned between the upper supporting member 311 and the lower supporting member 312.

Figure 1:
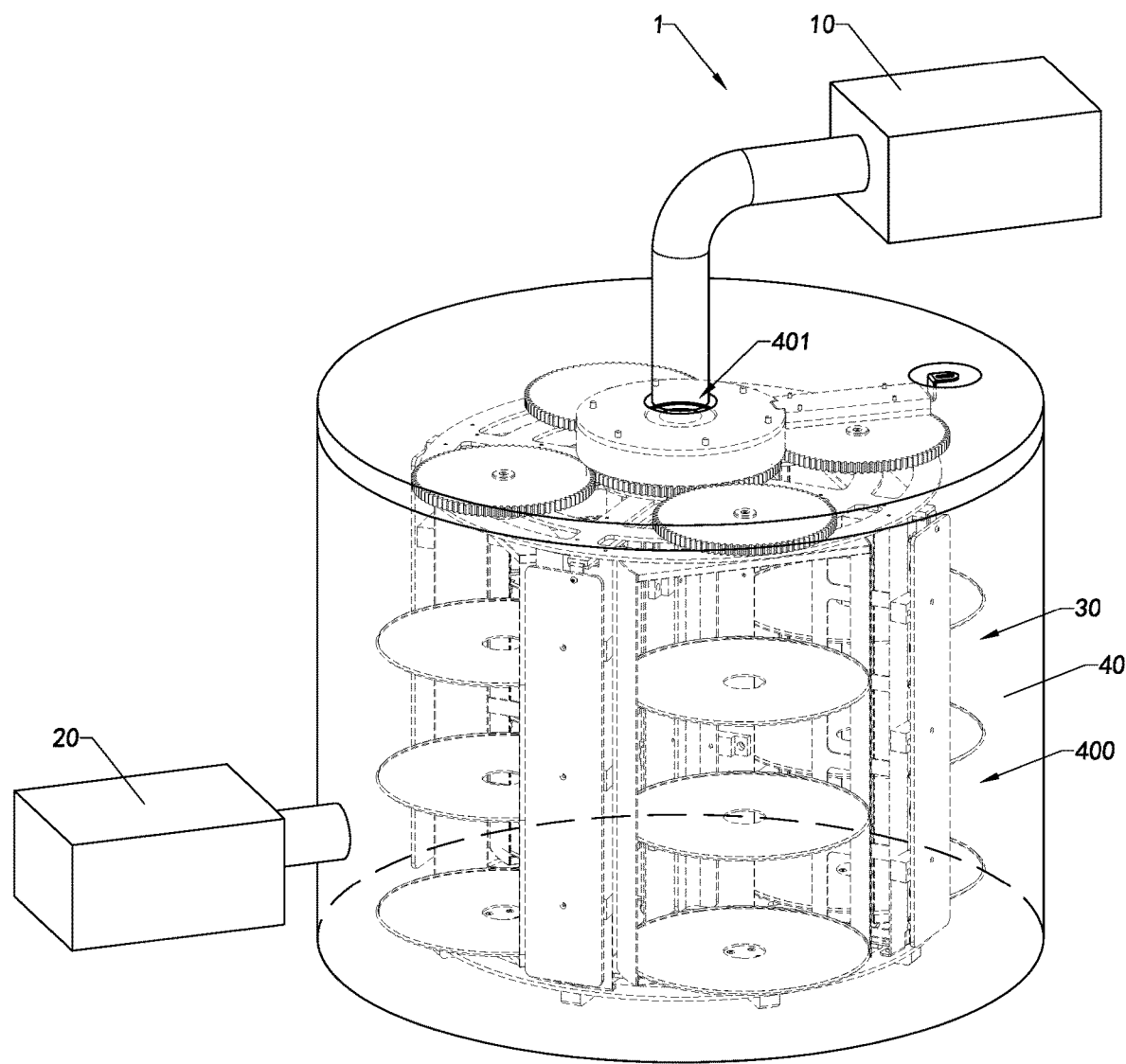
FIG. 1 is a perspective view of a coating apparatus according to a preferred embodiment of the present invention.
Figure 2:
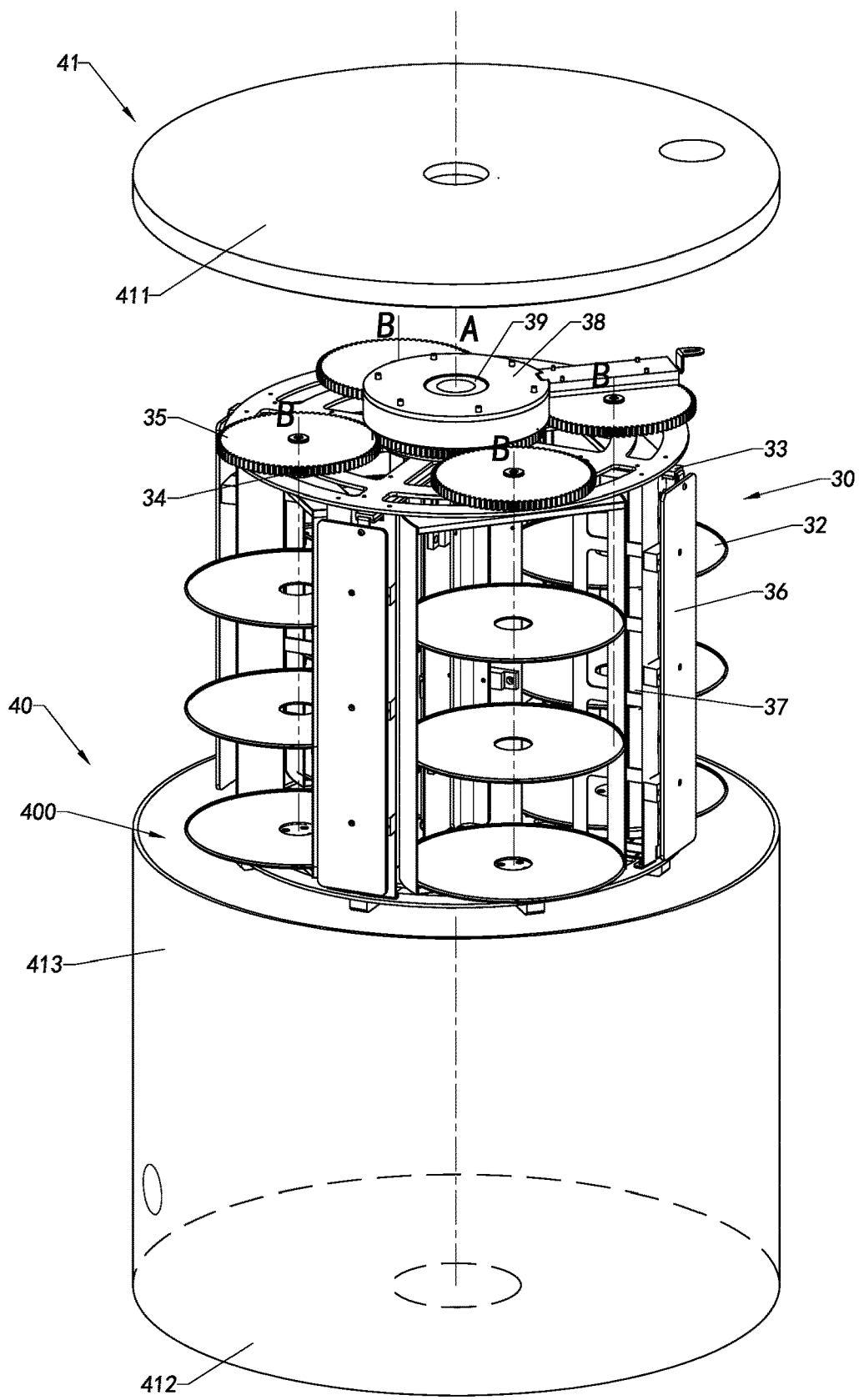
FIG. 2 is a perspective view of a movable support arrangement according to the above preferred embodiment of the present invention.
Figure 3:
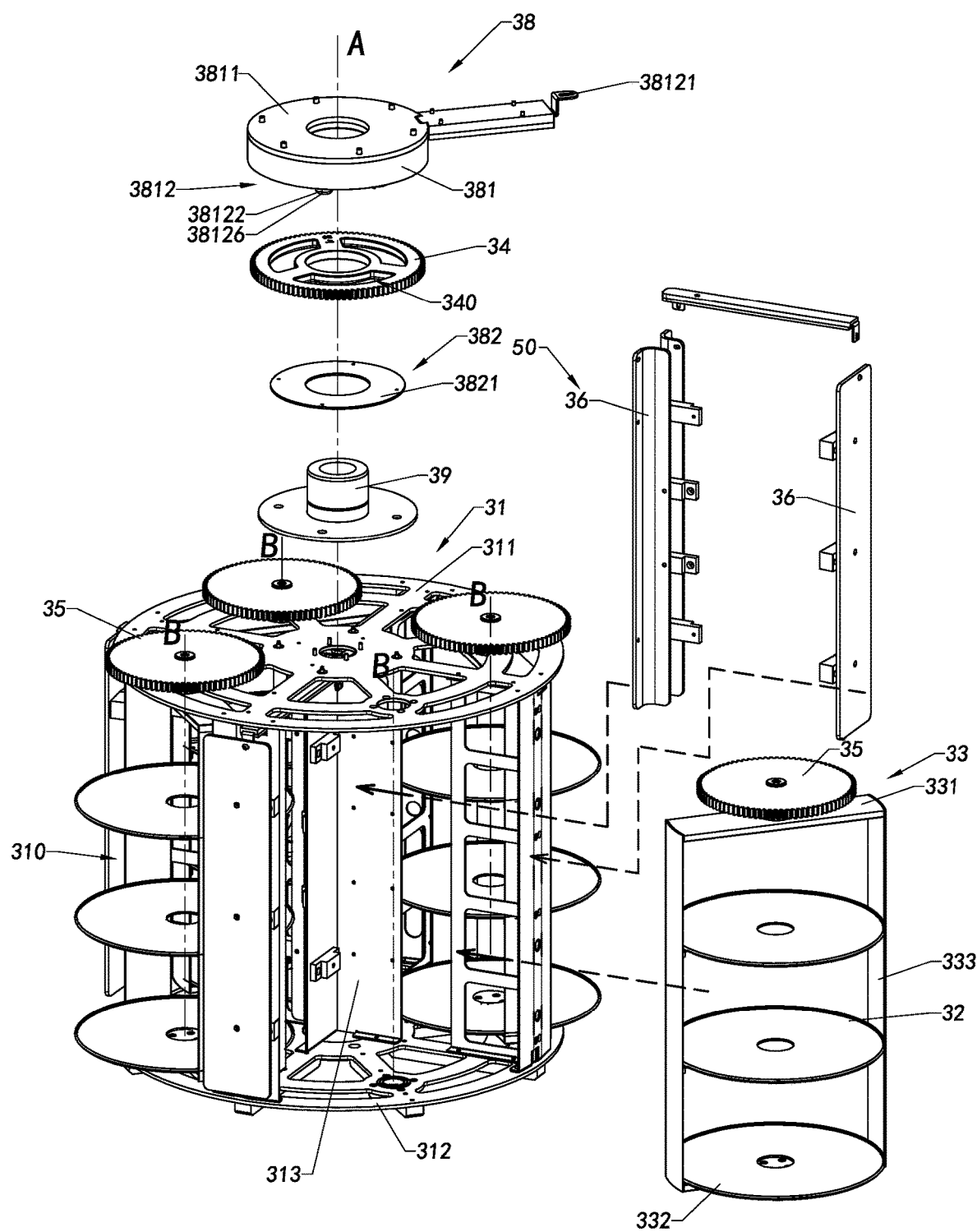
FIG. 3 is an exploded view of the movable support arrangement according to the above preferred embodiment of the present invention.

The quantity of the electrode 36 positioned at the middle position of the movable support 31 may be multiple, such as four. The four electrodes 36 positioned at the middle position of the movable support 31 are arranged in an opposing and symmetrical manner, as shown in FIGS. 2 and 3, so as for electrically discharging at the middle position of the movable support 31 when electrified. The other electrodes 36 can be arranged in the middle position of the outer side of the movable support 31, such as the peripheral positions of the movable support 31.

Preferably, the electrodes 36 are symmetrically arranged around the first axis A. It is worth mentioning that, according to the present embodiment, as shown in FIGS. 5A and 5B, at least one or more of the electrodes 36 are positioned at the inner side of the movable support 31, while at least one or more of the electrodes 36 are positioned at the outer side of the movable support 31. The electrodes 36 positioned at the outer side face toward the middle position of the movable support 31 and are adapted for electrically discharging towards the middle position of the movable support 31, so as to create and provide a plasma environment of the entire movable support 31. The electrodes 36 positioned at the inner side are inner electrodes 36b, and the electrodes 36 located in the outer side are outer electrodes 36a, wherein the inner electrodes 36b are closer to the first axis A than the outer electrodes 36a.

The inner electrodes 36b can electrically discharge towards the pillar 313 located at the middle position. At least a portion of the pillar 313 is made of electrically conducting material. Each of the outer electrodes 36a can discharge towards the respective electrical conducting member 51 located in the inner side. Each of the electrical conducting members 51 can be mounted on the respective electrode holder 37 in an insulated manner. In other words, the pillar 313 can provide the electrical conducting surface 511 for serving as at least portion of the electrical conducting member 51 for coordinating with the respective electrode 36 for electrical discharging.

Each of the electrodes 36 may be a plane electrode plate, a hollow configuration or an arc-electrode plate with a radian, as shown in FIG. 5B.

For instance, some of the electrodes 36 are arranged at the peripheral positions of the movable support 31 and the curvature of each of such electrodes 36 can be arranged to fit the curvature of the circumference of the movable support 31.

In other words, each of such electrodes 36 has an electrical discharge surface 361, wherein the electrical discharge surface 361 may face towards the middle position or other position of the movable support 31.

Such electrical discharge surface 361 may be a plane surface or a curve surface so as to facilitate providing an even and uniform electrical environment.

The entire electrode 36 may also be an arc-electrode, such as an arc electrode or an electrode with a wavy-shaped electrical discharge surface.

It is worth mentioning that, when the workpieces to be coated are rotated around with the first axis A as well as the second axis B, the workpieces to be coated can sometimes be rotated to the positions between the outer electrode 36a and the inner electrode 36b, that is the inner area located between two opposing electrodes 36, so that the plasma can be deposited on the surfaces of such workpieces to be coated faster due to the electrical field. Also, the workpieces to be coated can sometimes be rotated to the positions outside of the inner area between the inner electrode 36b and the outer electrode 36a, so as to avoid the surfaces of the respective workpieces to be coated from being damaged due to staying between the two opposing electrodes 36 for too long.

It is understandable that, according to the present invention, the reactor chamber body 40 may also have other electrodes arranged and affixed therein. These stationary electrodes electrically discharge at stationary positions to coordinate with the movable electrodes 36 as described above of the present invention, so as to provide an appropriate discharging environment in the reactor chamber body 40.

It is worth mentioning that the one or more electrodes 36 arranged on the movable support arrangement 30 are movable. Such movable electrodes 36 not only make coating evenly and uniformly, but also allow that portion of the coating material gas passing through the discharge area be completely ionized and portion of the coating material gas that do not pass through the discharge area between the electrodes 36 and the electrical conducting members 51 be incompletely ionized, so that the material(s) do not require ionization may be utilized to provide richer coating structure and stabler coating quality through the adjustment of the coating parameters.

Figure 5C:
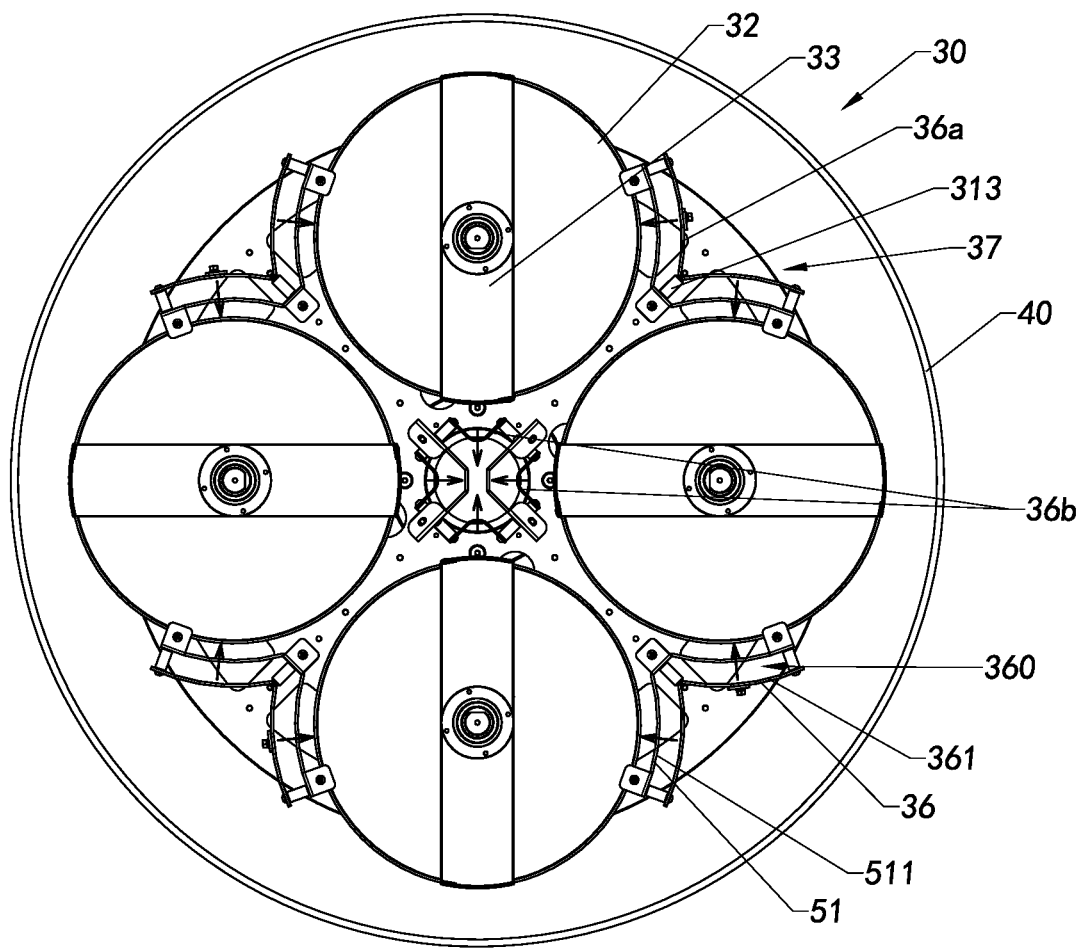
FIG. 5C is a schematic view illustrating electrical discharging of a movable support arrangement according to another alternative mode of the above preferred embodiment of the present invention.

The one or more electrodes 36 may also be arranged according to other modes. For example, FIG. 5C illustrates another alternative mode of the electrodes 36 of the movable support arrangement 30 according to the above preferred embodiment of the present invention.

According to this alternative mode, at least some of the electrodes 36 is arranged in a manner of facing toward the carriers 32. In other words, the electrical discharge surfaces 361 of at least some of the electrodes 36 face toward the carriers 32.

Each of the movable supports 31 has its carrying space 310, wherein the carrier support 33 thereof divides the carrying space 310.

At least one of the electrodes 36 is arranged around the respective carrier 32 corresponding to one of the carrier supports 33. Besides, the at least one of the electrodes 36 stands between the upper supporting member 311 and the lower supporting member 312 of the movable support 31.

The one or more electrodes 36 can electrically discharge towards the carriers 32 in the carrying space 310. A difference from the previous embodiment is that, according to the previous embodiment, all the electrodes 36 at the outer side face toward and electrically discharge toward the middle position of the movable support 31, so that the entire movable support 31 is a big plasma environment.

On the contrary, according to the present alternative mode, each of the electrodes 36 discharges at the position close to the corresponding carrier 32 and different electrode 36 is adjacent to one or more different carriers 32, that benefits the control of the evenness and uniformity of the coating for each of the carrying spaces 310.

Further, each of the carrier supports 33 is corresponding to at least two of the electrodes 36. Preferably, the at least two of the electrodes 36 are symmetrically arranged around the second axis B.

Specifically speaking, each of the electrodes 36 (outer electrode 36a) is arranged at a peripheral position of the movable support 31 and extended inwardly around the respective carrier 32. A predetermined distance is retained between each of the electrodes 36 (outer electrode 36a) with the respective carrier support 33 as well as the respective carrier 32, such that the electrodes 36 would not block the rotation of the carrier supports 33 and the rotation of the carriers 32 during the rotation of the carrier supports 33.

When each of the carrier supports 33 and the carriers 32 thereof rotates around the respective second axis B, the carrier supports 33 and the carriers 32 are moving relatively with the electrodes 36, which benefits the even and uniform diffusion and distribution of the plasma generated through discharging at the carriers 32.

It is worth noting that when each of the workpieces to be coated is rotated around the first axis A as well as the second axis B simultaneously, each of the workpieces can sometimes be rotated to a position between the electrodes 36 located on two sides of the corresponding carrier 32, that is an inner area between the two opposing electrodes 36, so that the plasma can be deposited on the one or more surfaces of that workpiece to be coated faster due to the electrical field. Each of the workpieces can sometimes be rotated to a position outside of the inner area of the opposing electrodes 36 located on the two sides of the corresponding carrier 32, so as to avoid the one or more surfaces of that workpiece to be coated from being damaged due to staying between the two opposing electrodes 36 for too long.

Further, some of the electrodes 36 are mounted on the pillars 313 of the electrode holder 37. Each of the pillars 313 is positioned at the inner side of the respective electrode 36 and has a hollow configuration, so as to facilitate the electrical discharging of the electrodes 36.

It is worth mentioning that, according to the present alternative mode, each of the electrodes 36 at the outer side has a predetermined curvature for facilitating the evenness and uniformity of the electrical discharge of the electrodes 36. The electrode holder 37 is arranged to have the same curvature of the respective electrode 36.

Specifically speaking, a moving path of each of the workpieces to be coated placed on the respective carrier 32 that rotates around the second axis B is a circular path and therefore each of the electrodes 36 is arranged to be an arc-electrode 36 for electrical discharging so as to coordinate and match the moving path of the corresponding workpiece to be coated, which can help to form an even and uniform coating environment for the workpieces to be coated.

Preferably, the curvature of the circular path of each of the workpieces to be coated has the same curvature of the respective electrode 36 while they share the same circle center.

Further, according to the present alternative mode, the quantity of the carrier support 33 is four, wherein each of the electrodes 36 is arranged between two adjacent carrier supports 33, and that the one or more electrodes 36 arranged between the two adjacent carrier supports 33 is mounted on the same electrode holder 37. The adjacent electrodes 36 can be connected with each other to form and define a V-shape like configuration with its V-shape opening facing outwards.

Figure 5D:
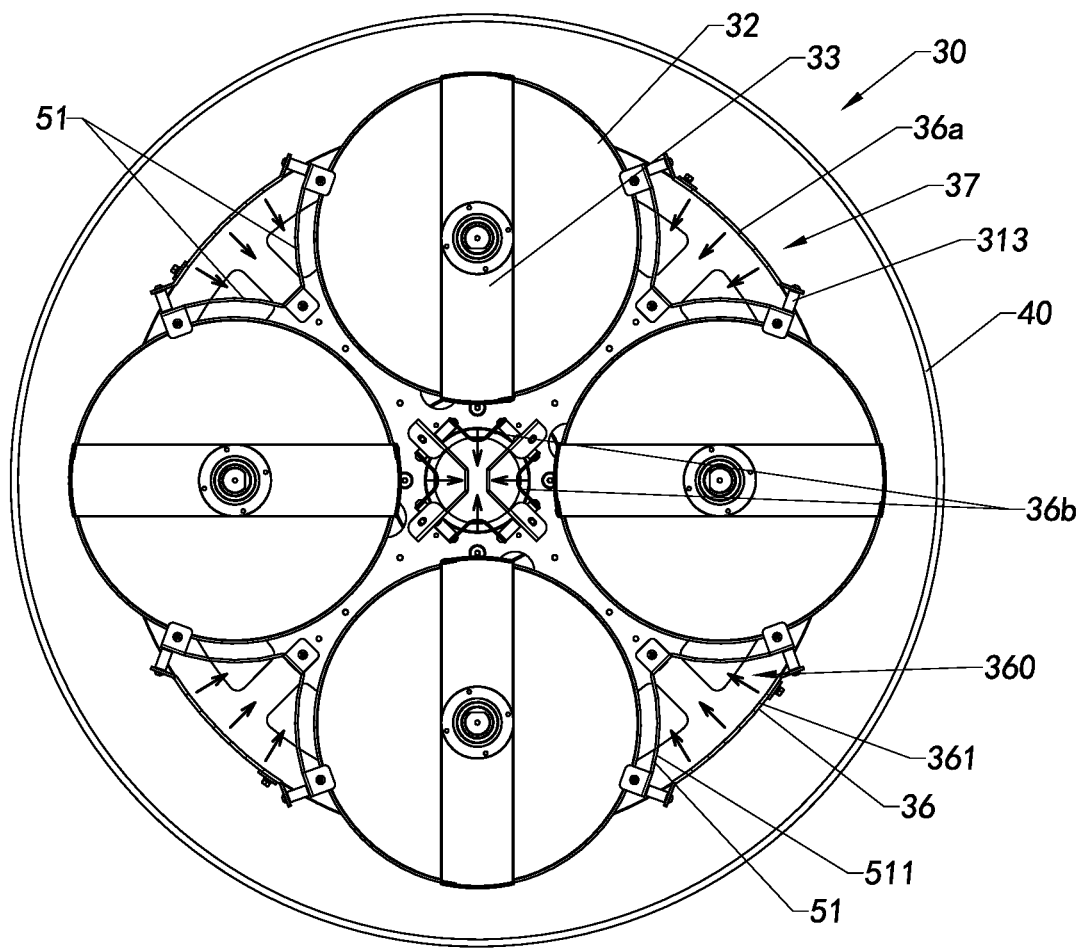
FIG. 5D is a schematic view illustrating electrical discharging of a movable support arrangement according to another alternative mode of the above preferred embodiment of the present invention.

Referring to FIG. 5D, the movable support arrangement 30 according to another alternative mode of the preferred embodiment of the present invention is illustrated. According to this alternative mode, each of the electrical conducting members 51 arranged correspondingly to the respective electrode 36 is arranged to face towards the respective carrier 32. The electrical discharge surface 361 of the respective electrode 36 and the electrical conducting surface 511 of the respective electrical conducting member 51 form an electrical discharge area 360, wherein the electrical discharge area 360 is a triangular chamber.

The adjacent electrical conducting members 51 form and define a V-shaped configuration. Each of the electrodes 36 is an electrode plate and faces towards the V-shaped configuration of the adjacent electrical conducting members 51 so as to form and define a triangular structure.

Specifically speaking, each of the electrical conducting members 51 can be arranged on the respective movable support 31 and is grounded. The adjacent electrical conducting members 51 are arranged between two of the adjacent carriers 32, wherein one of the electrical conducting members 51 faces toward one of the carriers 32 while the other electrical conducting member 51 faces toward the other carrier 32. The two adjacent electrical conducting members 51 form and define an included angle therebetween and the included angle faces toward the respective electrode 36 (outer electrode 36a).

One end of each of the electrodes 36 arranged between two adjacent carriers 32 is close to one of the adjacent carriers 32, while the other end of the electrode 36 is close to the other carrier 32. The distance between each of the electrodes 36 (outer electrodes 36a) and the respective electrical conducting member 51 gradually expands and then gradually reduces from one end to the other end of the corresponding electrode 36. In other words, the size of the electrical discharge area 360 gradually expands and then gradually reduces from one end to the other end of the corresponding electrode 36.

It is worth noting that each electrical conducting member 51 can be arranged to have a planar configuration or a curvy configuration. According to the present alternative mode, each electrical conducting member 51 is arranged to be curved toward the respective carrier 32.

In other words, the electrodes 36 and the electrical conducting members 51 are opposingly arranged, respectively. Because each electrode 36 and the respective electrical conducting member 51 form and define a triangular configuration, the grounding distance between each of the electrodes 36 and the respective grounded electrical conducting member 51 is variable. When the electrodes 36 electrically discharge, the electrical discharge can freely determine a best pathway within the electrical discharge area 360 among the electrodes 36 and the electrical conducting members 51, ensuring a more stable and reliable electrical discharging process.

It is worth mentioning that the plasma generated during the electrical discharging process can be restricted within the electrical discharge area 360 formed among the respective electrode 36 and the respective electrical conducting members 51, so as to benefit the external evenness and uniformity thereof.

Figure 5E:
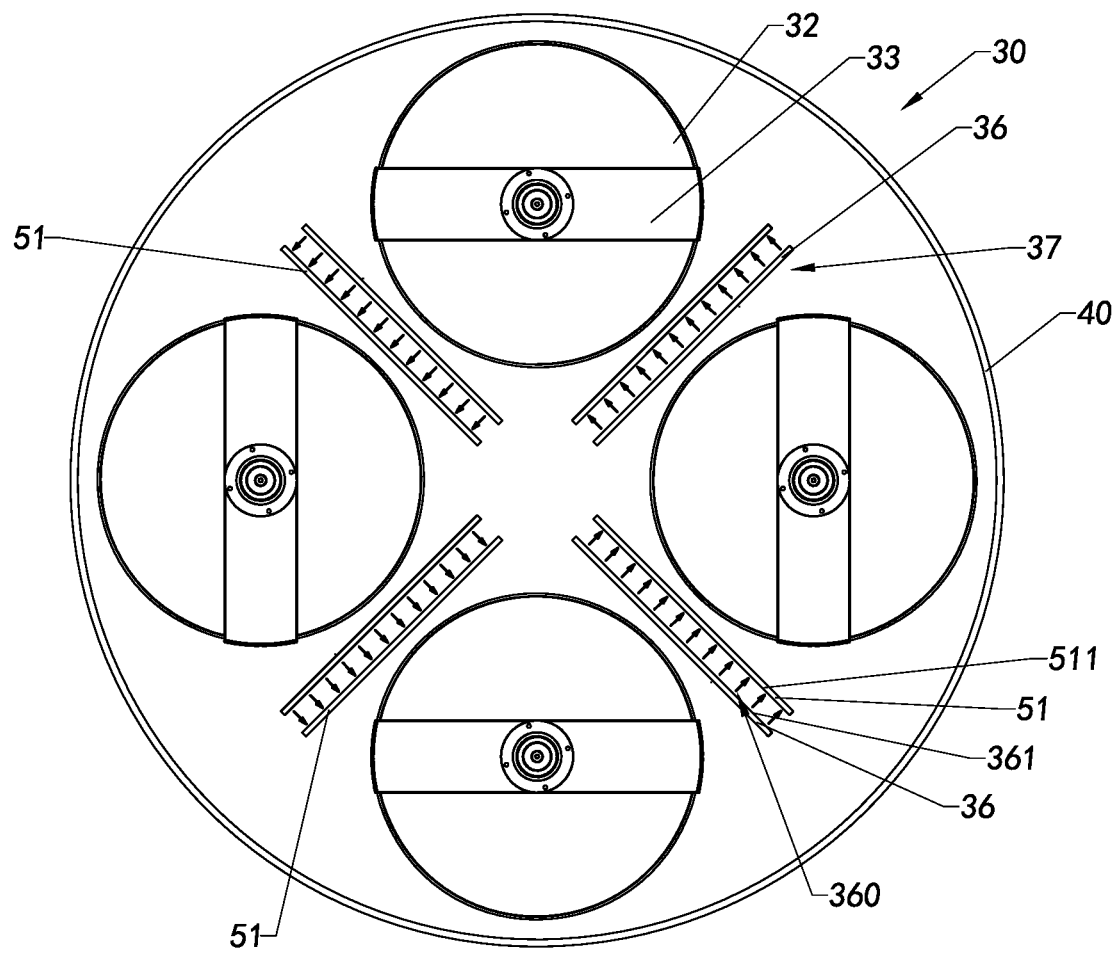
FIG. 5E is a schematic view illustrating electrical discharging of a movable support arrangement according to another alternative mode of the above preferred embodiment of the present invention.

Further, referring to FIG. 5E, the one or more electrodes 36 may each be arranged along a radial direction of the movable support 31. Specifically speaking, each of the electrodes 36 is arranged in a manner of extending from a position close to the first axis A to a position close to a peripheral position of the movable support 31.

The electrodes 36 are arranged between the adjacent carriers 32. Optionally, every two adjacent carriers 32 have one electrode 36 arranged therebetween. When the quantity of the carrier 32 is four, the quantity of the electrode 36 is four as well. Optionally, the electrical discharge direction of each of the electrodes 36 is the same, such as along a clockwise direction or a counterclockwise direction as viewed from a top view.

Preferably, the electrodes 36 are evenly and uniformly arranged around the first axis A, so as to facilitate providing an even and uniform electrical field for the one or more workpieces to be coated placed on each of the carriers 32.

Figure 6:
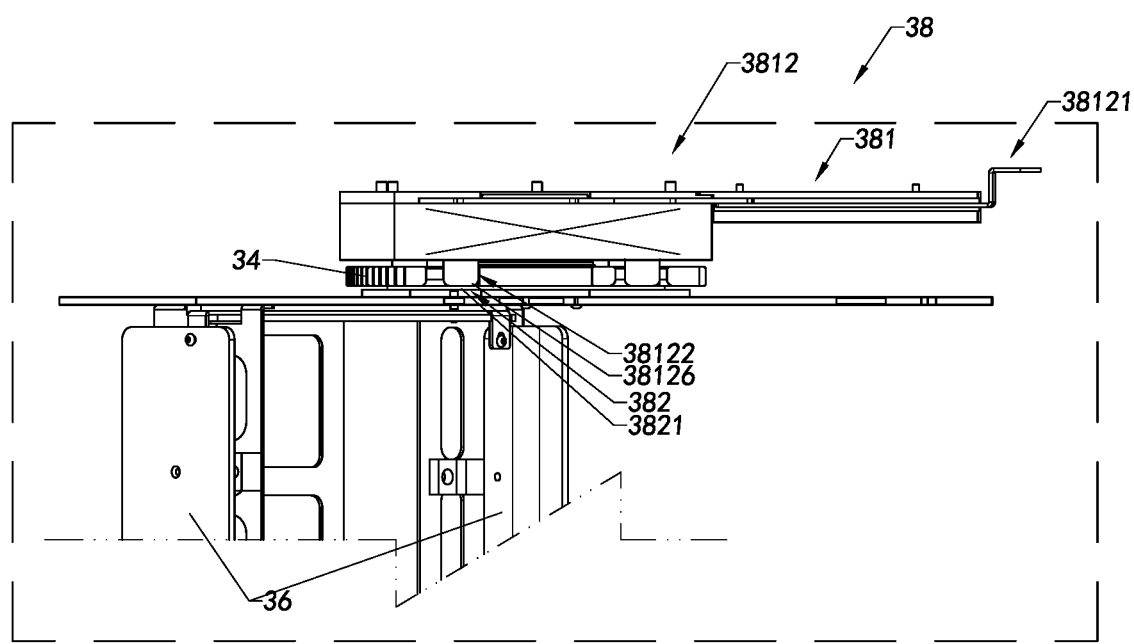
FIG. 6 is a schematic view illustrating a conduction mode of the electrode of the coating apparatus according to the above preferred embodiment of the present invention.

Further, referring to FIGS. 3 and 6, an electrical conductive unit 38 of the movable support arrangement 30 according to the above preferred embodiment of the present invention is illustrated.

The electrical conductive unit 38 comprises a first electrical conductive component 381 and a second electrical conductive component 382, wherein the first electrical conductive component 381 is mounted on the housing body 41 of the reactor chamber body 40, while the second electrical conductive component 382 is mounted on the movable support 31. In addition, the second electrical conductive component 382 is capable of moving together with the movable support 31.

The first electrical conductive component 381 and the second electrical conductive component 382 can move relatively with each other, so that when the movable support 31 of the movable support arrangement 30 rotates relative to the reactor chamber body 40, an external power source can still supply power to the one or more electrodes 36 that rotate together with the movable support 31 in the reactor chamber body 40.

According to the present embodiment, the first electrical conductive component 381 is arranged at the upper housing 411 of the housing body 41 and is supported on the upper supporting member 311 of the movable support 31. In other words, the first electrical conductive component 381 of the electrical conductive unit 38 is positioned between the upper housing 411 and the movable support 31. The first electrical conductive component 381 is for transmitting the electric power outside of the reactor chamber body 40 to the movable support 31 inside of the reactor chamber body 40. The second electrical conductive component 382 is arranged on the movable support 31 for transmitting the electric power from the second electrical conductive component 382 to the one or more electrodes 36 arranged at the movable support 31.

Specifically speaking, the first electrical conductive component 381 comprises an electrical conduction assembly 3812 and the electrical conduction assembly 3812 has an insulation unit 3811 arranged thereon, wherein the insulation unit 3811 forms and defines an insulation space and the electrical conduction assembly 3812 is positioned in the insulation space formed and defined by the insulation unit 3811.

The electrical conduction assembly 3812 has a first electrical conduction terminal 38121 and a second electrical conduction terminal 38122, wherein the first electrical conduction terminal 38121 is utilized for connecting with external power supply and is exposed outside of the insulation space. The second electrical conduction terminal 38122 is utilized for conductively connecting with the second electrical conductive component. The second electrical conduction terminal 38122 is exposed outside of the insulation space.

The second electrical conduction terminal 38122 of the electrical conduction assembly 3812 of the first electrical conductive component 381 is conductively connected with the second electrical conductive component 382 so as for transmitting external electricity to the electrodes 36.

Specifically speaking, when the second electrical conductive component 382 is moving relative to the second electrical conduction terminal 38122 of the first electrical conductive component 381, the second electrical conduction terminal of the first electrical conductive component 381 is always communicatively connected with the second electrical conductive component 382, so as to maintain a stability of the power supply for the electrodes 36. The upper housing 411 of the housing body 41 of the reactor chamber body 40 may have a hole arranged therein, so as to expose the second electrical conduction terminal 38122 of the first electrical conductive component 381 for allowing the first electrical conductive component 381 to electrically conduct with the external source.

The first electrical conductive component 381 may also be extended to approach the side wall 413 of the housing body 41. Besides, the side wall 413 of the housing body 41 may also have a hole arranged therein so as to allow the second electrical conduction terminal 38122 to pass through the side wall 413 of the housing body 41 and be connected to outside.

According to the present embodiment, the first electrical conductive component 381 is extended towards a direction away from a central axis of the movable support 31, so as to allow the second electrical conduction terminal 3812 of the first electrical conductive component 381 to be positioned at a farther position.

At least a portion of the second electrical conductive component 382 is located on the upper supporting member 311 of the movable support 31 while at least a portion thereof is exposed from a top side of the upper supporting member 311 for being connected with the first electrical conductive component 381. One end of the second electrical conductive component 382 is electrically connected with the first electrical conductive component 381, while the other end of the second electrical conductive component 382 is electrically connected with each of the electrodes 36, such that electricity from outside can be transmitted to the one or more electrodes 36 through the electrical conductive unit 38.

It is worth noting that, according to the present embodiment, the electrical conductive unit 38 is mounted on a central axial position of the movable support 31, while the movable support engaging member 34 is also positioned at this position.

The movable support engaging member 34 is embodied as a circular gear having a plurality of channels 340 formed therethrough, wherein one or more portions of the first electrical conductive component 381 pass through the plurality of channels 340 of the movable support engaging member 34 from its top downwardly to be conductively attached on a conductive spacer 3821 of the second electrical conductive component 382 arranged coaxially below the movable support engaging member 34.

Further, according to the present embodiment, the channels 340 of the movable support engaging member 34 are independent channels without communication with each other, such that the rotation of the movable support engaging member 34 will be restricted by an electric conduction member 38126 of the first electrical conductive component 381.

When the movable support 31 rotates relative to the reactor chamber body 40, the rotation of the movable support engaging member 34 about its own axis may also be limited. The one or more carrier motion transmission members 35 positioned around the movable support engaging member 34 can still be transmitted to rotate around the movable support engaging member 34, that is around the first axis A, as well as rotate about the one or more second axes B respectively at the same time.

The rotation of each of the one or more carrier motion transmission members 35 is restricted by the movable support engaging member 34, while the rotations of the carrier motion transmission members 35 can be retained evenly and uniformly through the movable support engaging member 34, so as to facilitate the evenness and uniformity of the coating.

It is worth noting that the electrical conductive unit 38 can be detachably connected with the housing body 41 of the reactor chamber body 40, so as to facilitate the replacement and maintenance of the electrical conductive unit 38.

Figure 7:
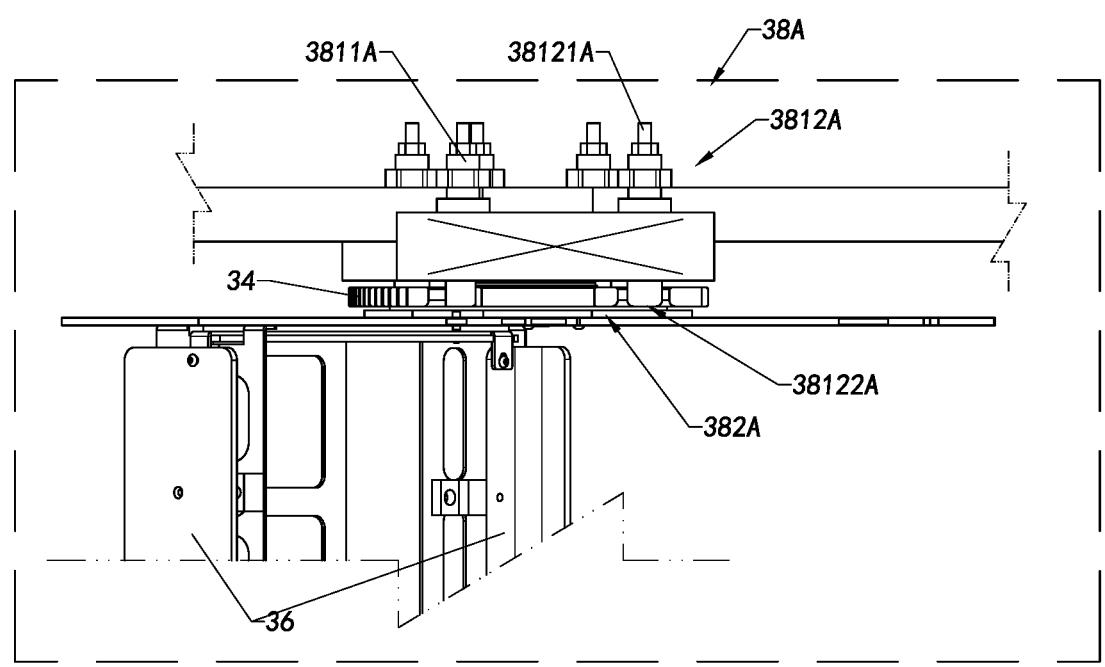
FIG. 7 is a schematic view illustrating another conduction mode of the electrode of the coating apparatus according to the above preferred embodiment of the present invention.

As shown in FIG. 7, also referring to FIG. 3, the electrical conductive unit 38A according to another alterative mode of the above preferred embodiment of the present invention is illustrated.

According to this another alternative mode, the electrical conductive unit 38A comprises a first electrical conductive component 381A and a second electrical conductive component 382A, wherein the first electrical conductive component 381A arranged at the upper housing 411 of the housing body 41 of the reactor chamber body 40, while the second electrical conductive component 382A is arranged on the movable support 31.

The first electrical conductive component 381A can be conductively connected with the second electrical conductive component 382A. Besides, when the second electrical conductive component 382A rotates together with the movable support 31, the first electrical conductive component 381A and the second electrical conductive component 382A that move relatively with each other can still maintain to be electrically connected, such that the one or more electrodes 36 in the reactor chamber body 40 can still be continuously powered.

Specifically speaking, the first electrical conductive component 381A comprises an electrical conduction assembly 3812A and the electrical conduction assembly 3812A has an insulation unit 3811A arranged thereon, wherein the insulation unit 3811A forms and defines an insulation space and the electrical conduction assembly 3812A is positioned inside the insulation space formed and defined by the insulation unit 3811.

The electrical conduction assembly 3812A has a first electrical conduction terminal 38121A and a second electrical conduction terminal 38122A, wherein the first electrical conduction terminal 38121A is utilized for connecting with external power supply and is exposed outside of the insulation space. The second electrical conduction terminal 38122A is utilized for conductively connecting with the second conduction unit 382A. The second electrical conduction terminal 38122A is exposed outside of the insulation space.

The second electrical conduction terminal 38122A of the first electrical conductive component 381A is conductively connected with the second electrical conductive component 382A so as for transmitting external electricity to the electrodes 36.

A difference between this another alternative mode and the previous embodiment is that, according to the this another alternative mode, the first electrical conduction terminal 38121A of the first electrical conductive component 381A is positioned above the second electrical conduction terminal 38122A.

Further, the movable support engaging member 34 has at least one channel 340. At least a portion of the first electrical conductive component 381A passes through the channel 340 of the movable support engaging member 34 to electrically connect with the second electrical conductive component 382A.

The movable support engaging member 34 may be made of insulation material. Optionally, the second electrical conductive component 382A is positioned below the movable support engaging member 34 and at least a portion of the second electrical conductive component 382A can directly face the channel 340 of the movable support engaging member 34 so as to reduce the contact between the second electrical conductive component 382A and the movable support engaging member 34, which results in reducing the friction between the movable support engaging member 34 and the second electrical conductive component 382A.

Figure 8:
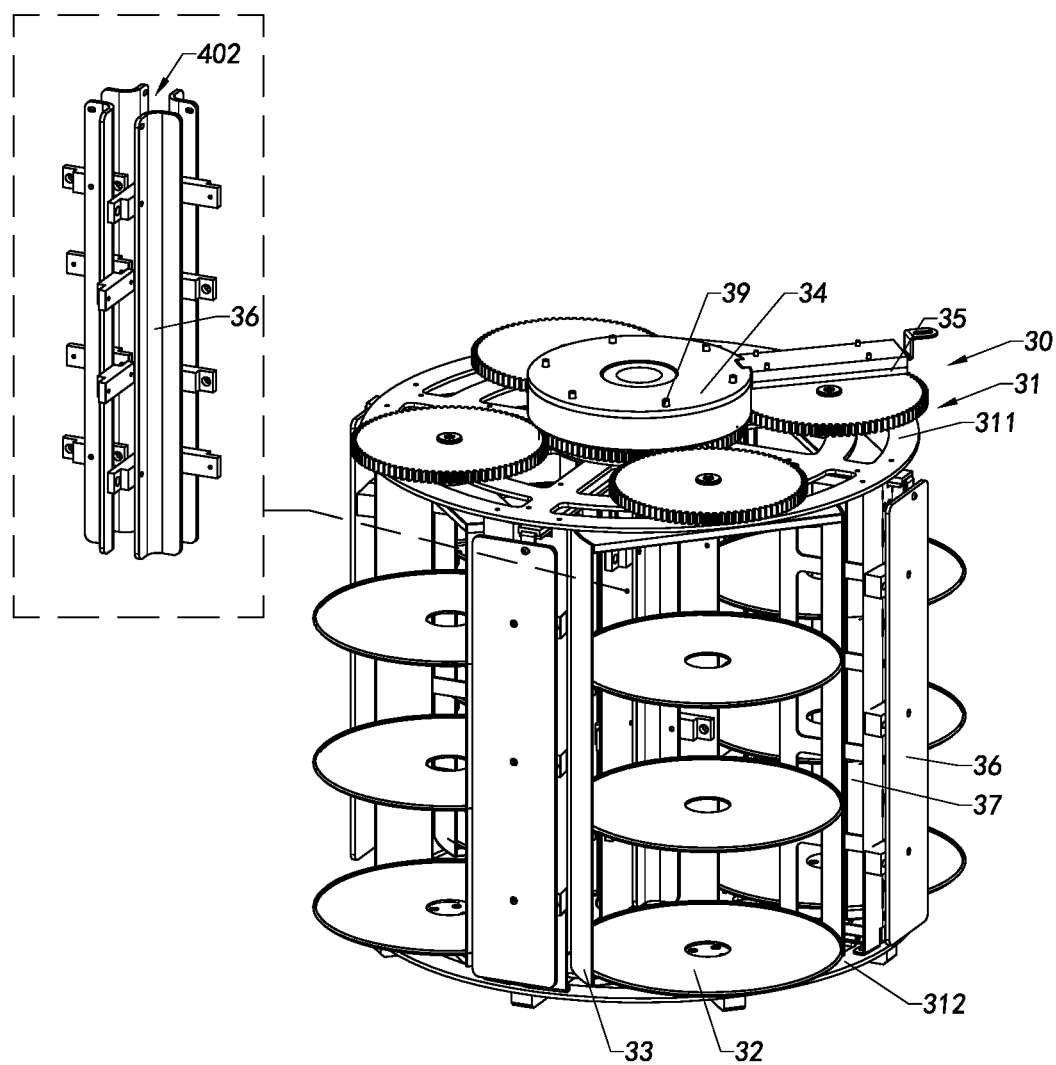
FIG. 8 is a perspective view illustrating gas feeding of the coating apparatus according to the above preferred embodiment of the present invention.

Further, referring to FIG. 8, the movable support arrangement 30 can comprise one or more connecting shafts 39, wherein the one or more connecting shafts 39 can be connected with the movable support 31, such that the movable support 31 is able to be driven to rotate by driving at least one of the connecting shafts 39.

According to present embodiment, the quantity of the connecting shaft 39 is embodied as two. One of the connecting shafts 39 is located on the upper supporting member 311 of the movable support 31 while the other of the connecting shafts 39 is located on the lower supporting member 312 of the movable support 31. The two connecting shafts 39 are located at the central axis of the movable support 31.

The reactor chamber body 40 of the coating apparatus 1 has a feeding inlet 401, as shown in FIGS. 8 and 9. The feeding inlet 401 can be be arranged at a middle position on the upper housing 411 of the housing body 41 of the reactor chamber body 40 or any predetermined position on the upper housing 411, such as to be symmetrically arranged at a position around the first axis A.

The feeding inlet 401 at the middle position is communicated with a feed channel 402 arranged in the movable support arrangement 30. The feed channel 402 is formed in a middle position of the movable support arrangement 30, such as longitudinally extended and defined among a plurality of the electrodes 36, wherein each of the electrodes 36 may have a partially hollow configuration for the reactant gas to pass through. The connecting shaft 39 may pass through the electrical conductive unit 38.

According to the above preferred embodiment and its alternative modes of the present invention, the present invention provides an electrode discharge method, comprising a step of:

during the revolving of the carrier 32 around the first axis A as well as the rotating of the carrier 32 around the second axis B at the same time, electrically discharging by the one or more electrodes 36 mounted on the movable support 31 towards the movable support 31 while the movable support 31 rotating around the first axis A.

It is understandable that, according to the coating technology, the one or more electrodes 36 may face and electrically discharge towards the one or more workpieces to be coated while the one or more workpieces to be coated are revolving around the first axis A and rotating around the second axis B at the same time, wherein the relative movement between the one or more workpieces to be coated and the one or more electrodes 36 is only the rotation of the one or more workpieces to be coated around the second axis B, such that it allows the electrodes 36 to generate an even and uniform ionization environment for the one or more workpieces to be coated placed on the one or more carriers 32, that enhances the evenness and uniformity of the coating for the one or more workpieces to be coated on the one or more carriers 32.

According to at least one embodiment of the present invention, the electrodes 36 respectively arranged at the peripheral positions of the movable support 31 electrically discharge towards the middle position of the movable support 31, wherein the workpieces to be coated are placed between the upper supporting member 311 and the lower supporting member 312 of the movable support 31.

According to at least one embodiment of the present invention, the electrodes 36 respectively arranged at the peripheral positions of the movable support 31 electrically discharge towards the workpieces to be coated.

According to at least one embodiment of the present invention, the one or more electrodes 36 evenly arranged at the one or more peripheral positions of the movable support 31 discharge towards the workpieces to be coated.

According to another aspect of the present invention, the present invention provides an electrode charging method, comprising a step of:

transmitting external electricity from the first electrical conductive component 381 to the second electrical conductive component 382 that rotates relative to the first electrical conductive component 381 and is electrically connected with the one or more electrode 36, so as to transmit the electricity to the one or more electrodes 36.

According to at least one embodiment of the present invention, the second electrical conductive component 382 and the one or more electrodes 36 rotate around the first axis A together.

According to at least one embodiment of the present invention, at least one of the electrodes 36 is positioned at a middle position of the movable support 31 and at least one of the electrodes 36 is positioned at a peripheral position of the movable support 31.

One skilled in the art will understand that the embodiment of the present invention as shown in the drawings and described above is exemplary only and not intended to be limiting. It will thus be seen that the objects of the present invention have been fully and effectively accomplished. The embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. A coating apparatus for coating one or more workpieces, comprising:
   a reactor chamber body having a reactor chamber and a feed inlet communicating with said reactor chamber;
   a feeding arrangement communicatively connected to said feed inlet for feeding a reactant gas in said reactor chamber;
   a gas extracting arrangement communicatively connected with said reactor chamber body for extracting the reactant gas; and
   a movable support arrangement, which is movably received in said reactor chamber, comprising:
   one or more electrodes; and
   a movable support, arranged in a movable manner relative to the reactor chamber body, wherein said one or more electrodes are arranged on said movable support in a manner that said one or more electrodes are movable together with said movable support for forming an ionized environment when said one or more electrodes are electrified for ionizing the reactant gas in said reactor chamber for depositing on one or more surfaces of the one or more workpieces, which are supported on said movable support and moved together with said movable support, for forming coating layers on the one or more surfaces of the one or more workpieces;
   wherein said movable support arrangement further comprises one or more carriers adapted for holding the one or more workpieces thereon and arranged at said movable support in such a manner that said one or more carriers are movable relative to said one or more electrodes so as for moving the one or more workpieces for relative movement with respect to said one or more electrode.

2. The coating apparatus, as recited in claim 1, wherein said one or more carriers are rotatable around a first axis of said movable support while each of said one or more carriers is rotatable around a second axis at the same time so as for moving the one or more workpieces placed on said one or more carriers respectively for relative rotation movement with respect to said one or more electrodes.

3. The coating apparatus, as recited in claim 1, wherein said movable support arrangement further comprises one or more carrier supports movably arranged at said movable support, wherein at least one of said one or more carriers is mounted to one of said one or more carrier supports so that said one or more carriers are driven to move relative to said moveable support by said one or more carrier supports respectively while said movable support is movable relative to said reactor chamber body.

4. The coating apparatus, as recited in claim 2, wherein said movable support arrangement further comprises one or more carrier supports rotatably mounted to said movable support, wherein each of said one or more carrier supports is rotatable about said second axis that is a central axis of said respective carrier support, wherein at least one of said one or more carriers is mounted to each of said one or more carrier supports in such manner that said one or more carriers are driven to rotate by said one or more carrier supports respectively relative to said movable support, while said movable support is able to be revolved about said first axis relative to said reactor chamber body at the same time.

5. The coating apparatus, as recited in claim 1, wherein each of said one or more electrodes is arranged at a circumferential direction of said movable support and has an electrical discharge surface arranged facing towards a central axis of said movable support.

6. The coating apparatus, as recited in claim 3, wherein each of said one or more electrodes is arranged at a circumferential direction of said movable support and has an electrical discharge surface arranged facing towards a central axis of said movable support.

7. The coating apparatus, as recited in claim 4, wherein each of said one or more electrodes is arranged at a circumferential direction of said movable support and has an electrical discharge surface arranged facing towards a central axis of said movable support.

8. The coating apparatus, as recited in claim 1, wherein each of said one or more electrodes has an electrical discharge surface arranged for facing towards at least one of said one or more carriers.

9. The coating apparatus, as recited in claim 4, wherein each of said one or more electrodes has an electrical discharge surface arranged for facing towards at least one of said one or more carriers.

10. The coating apparatus, as recited in claim 1, wherein each of said one or more electrodes is arranged at a radial direction of said movable support.

11. The coating apparatus, as recited in claim 3, wherein each of said one or more electrodes is arranged between two adjacent carrier supports of said one or more carrier supports and faces towards said two adjacent carrier supports.

12. The coating apparatus, as recited in claim 4, wherein each of said one or more electrodes is arranged between two adjacent carrier supports of said one or more carrier supports and faces towards said two adjacent carrier supports.

13. The coating apparatus, as recited in claim 3, wherein two adjacent electrodes of said one or more electrodes form a V-shaped configuration with a V-shaped opening facing outwards, wherein said two adjacent electrodes are respectively and correspondingly facing towards two adjacent carrier supports of said one or more carrier supports.

14. The coating apparatus, as recited in claim 4, wherein two adjacent electrodes of said one or more electrodes form a V-shaped configuration with a V-shaped opening facing outwards, wherein said two adjacent electrodes are respectively and correspondingly facing towards two adjacent carrier supports of said one or more carrier supports.

15. The coating apparatus, as recited in claim 1, wherein said movable support further comprises one or more electrical conducting members arranged corresponding to said one or more electrodes respectively, wherein each of said electrical conducting members and one of said one or more electrodes are two opposing electrodes.

16. The coating apparatus, as recited in claim 2, wherein said movable support further comprises one or more electrical conducting members arranged corresponding to said one or more electrodes respectively, wherein each of said electrical conducting members and one of said one or more electrodes are two opposing electrodes.

17. The coating apparatus, as recited in claim 3, wherein said movable support further comprises one or more electrical conducting members arranged corresponding to said one or more electrodes respectively, wherein each of said electrical conducting members and one of said one or more electrodes are two opposing electrodes.

18. The coating apparatus, as recited in claim 4, wherein said movable support further comprises one or more electrical conducting members arranged corresponding to said one or more electrodes respectively, wherein each of said electrical conducting members and one of said one or more electrodes are two opposing electrodes.

19. The coating apparatus, as recited in claim 7, wherein said movable support further comprises one or more electrical conducting members arranged corresponding to said one or more electrodes respectively, wherein each of said electrical conducting members and one of said one or more electrodes are two opposing electrodes.

20. The coating apparatus, as recited in claim 9, wherein said movable support further comprises one or more electrical conducting members arranged corresponding to said one or more electrodes respectively, wherein each of said electrical conducting members and one of said one or more electrodes are two opposing electrodes.

21. The coating apparatus, as recited in claim 12, wherein said movable support further comprises one or more electrical conducting members arranged corresponding to said one or more electrodes respectively, wherein each of said electrical conducting members and one of said one or more electrodes are two opposing electrodes.

22. The coating apparatus, as recited in claim 15, wherein each of said one or more electrodes has an electrical discharge surface and each of said electrical conducting members has an electrical conducting surface, wherein said electrical conducting surfaces of two adjacent electrical conducting members of said two or more electrical conducting members with an included angle therebetween and said electrical discharge surface of one of said one or more electrodes are arranged correspondingly to form a triangular electrical discharge area.

23. The coating apparatus, as recited in claim 18, wherein each of said one or more electrodes has an electrical discharge surface and each of said electrical conducting members has an electrical conducting surface, wherein said electrical conducting surfaces of two adjacent electrical conducting members of said two or more electrical conducting members with an included angle therebetween and said electrical discharge surface of one of said one or more electrodes are arranged correspondingly to form a triangular electrical discharge area.

24. The coating apparatus, as recited in claim 3, further comprising an electrical conductive unit which comprises a first electrical conductive component and a second electrical conductive component, wherein said first electrical conductive component is mounted on said reactor chamber body while said second electrical conductive component is mounted on said movable support and electrically connected with said one or more electrodes, wherein when said movable support which is grounded rotates relative to said reactor chamber body around said first axis, said second electrical conductive component, which rotates relative to said first electrical conductive component, is kept electrically conductive with said first electrical conductive component, to allow electricity power from outside of said reactor chamber body to be transmitted to said second electrical conductive component through said first electrical conductive component, and then to said one or more electrodes.

25. The coating apparatus, as recited in claim 4, further comprising an electrical conductive unit which comprises a first electrical conductive component and a second electrical conductive component, wherein said first electrical conductive component is mounted on said reactor chamber body while said second electrical conductive component is mounted on said movable support and electrically connected with said one or more electrodes, wherein when said movable support which is grounded rotates relative to said reactor chamber body around said first axis, said second electrical conductive component, which rotates relative to said first electrical conductive component, is kept electrically conductive with said first electrical conductive component, to allow electricity power from outside of said reactor chamber body to be transmitted to said second electrical conductive component through said first electrical conductive component, and then to said one or more electrodes.

26. The coating apparatus, as recited in claim 24, wherein said movable support comprises an upper supporting member and a lower supporting member, wherein said upper supporting member is held above said lower supporting member so as to form and define a carrying space therebetween, wherein said second electrical conductive component is arranged on said upper supporting member and said first electrical conductive component is tightly pressed and supported on said second electrical conductive component.

27. The coating apparatus, as recited in claim 25, wherein said movable support comprises an upper supporting member and a lower supporting member, wherein said upper supporting member is held above said lower supporting member so as to form and define a carrying space therebetween, wherein said second electrical conductive component is arranged on said upper supporting member and said first electrical conductive component is tightly pressed and supported on said second electrical conductive component.

28. The coating apparatus, as recited in claim 3, wherein each of said carrier supports comprises a carrier motion transmission member, wherein said movable support comprises a movable support engaging member engaging with said carriers motion transmission members, wherein said carrier motion transmission members and said movable support engaging member are gears engaged with each other for producing relative planetary gear movement.

29. The coating apparatus, as recited in claim 4, wherein each of said carrier supports comprises a carrier motion transmission member, wherein said movable support comprises a movable support engaging member engaging with said carriers motion transmission members, wherein said carrier motion transmission members and said movable support engaging member are gears engaged with each other for producing relative planetary gear movement.

30. The coating apparatus, as recited in claim 3, wherein each of said one or more electrodes has an electrical discharge surface arranged for facing towards at least one of said one or more carriers.

\* \* \* \* \*